(12) United States Patent
Anton et al.

(10) Patent No.: US 8,123,967 B2
(45) Date of Patent: Feb. 28, 2012

(54) METHOD OF PRODUCING AN ARTICLE HAVING PATTERNED DECORATIVE COATING

(75) Inventors: Bryce Anton, Longmont, CO (US);
Richard P. Welty, Boulder, CO (US);
Patrick Sullivan, Longmont, CO (US)

(73) Assignee: Vapor Technologies Inc., Longmont, CO (US)

( * ) Notice: Subject to any disclaimer, the term of this patent is extended or adjusted under 35 U.S.C. 154(b) by 576 days.

(21) Appl. No.: 12/166,102

(22) Filed: Jul. 1, 2008

(65) Prior Publication Data

US 2008/0264903 A1 Oct. 30, 2008

Related U.S. Application Data

(62) Division of application No. 11/194,222, filed on Aug. 1, 2005.

(51) Int. Cl.
*B44C 1/22* (2006.01)
(52) U.S. Cl. ............... 216/40; 216/18; 216/41; 430/128
(58) Field of Classification Search ............. 216/40, 216/41, 75, 76, 17, 18; 430/138, 128, 130; 427/497, 500
See application file for complete search history.

(56) References Cited

U.S. PATENT DOCUMENTS 1,005,870 A 10/1911 Packer
(Continued)

FOREIGN PATENT DOCUMENTS

CN 1614075 5/2005
(Continued)

OTHER PUBLICATIONS

Canadian Office Action dated Oct. 1, 2007 for Canadian Application No. 2,549,981, 2 pages.
(Continued)

*Primary Examiner* — Lan Vinh
(74) *Attorney, Agent, or Firm* — Rathe Lindenbaum

(57) ABSTRACT

A method for producing an article having a decorative coating includes depositing at least a first coating layer onto at least a portion of a substrate using a physical or chemical vapor deposition method in a vacuum chamber at sub-atmospheric pressure, the first coating layer comprising a first material having a first color. The method also includes patterning the first coating layer using a non-uniform patterning process to form a patterned coating layer having penetrations through which a portion of an underlying surface is visible, the underlying surface comprising a second material and having a second color that is visually contrasting to the first color. The patterned first coating layer comprises a decorative pattern comprising features distinguishable by an unaided human eye.

13 Claims, 7 Drawing Sheets

U.S. PATENT DOCUMENTS

| | | | |
|---|---|---|---|
| 2,020,286 A | 11/1935 | Bittle | |
| 2,411,867 A | 12/1946 | Brenner | |
| 2,639,116 A | 5/1953 | Green | |
| 2,793,282 A | 5/1957 | Steigerwald | |
| 2,820,757 A | 1/1958 | Belke | |
| 2,861,166 A | 11/1958 | Cargill, Jr. | |
| 2,898,285 A | 8/1959 | Henson | |
| 2,947,610 A | 8/1960 | Hall et al. | |
| 2,968,723 A | 1/1961 | Steigerwald | |
| 2,973,994 A | 3/1961 | Wells | |
| 3,042,605 A | 7/1962 | Belke | |
| 3,141,746 A | 7/1964 | De Lai | |
| 3,207,582 A | 9/1965 | Inoue | |
| 3,272,733 A | 9/1966 | Belke | |
| 3,346,458 A | 10/1967 | Schmidt | |
| 3,384,119 A | 5/1968 | Manoogian | |
| 3,474,008 A | 10/1969 | Buisman | |
| 3,607,061 A | 9/1971 | Angus | |
| 3,615,208 A | 10/1971 | Byron | |
| 3,630,677 A | 12/1971 | Angus | |
| 3,630,678 A | 12/1971 | Gardner | |
| 3,630,679 A | 12/1971 | Angus | |
| 3,667,503 A | 6/1972 | Farrell et al. | |
| 3,702,573 A | 11/1972 | Nemeth | |
| 3,707,445 A | 12/1972 | Green | |
| 3,714,332 A | 1/1973 | Rasquin et al. | |
| 3,747,638 A | 7/1973 | Manoogian et al. | |
| 3,766,914 A | 10/1973 | Jacobs | |
| 3,794,026 A | 2/1974 | Jacobs | |
| 3,813,296 A | 5/1974 | McStrack et al. | |
| 3,840,451 A | 10/1974 | Golyanov et al. | |
| 3,843,495 A * | 10/1974 | Malak | 205/112 |
| 3,854,493 A | 12/1974 | Farrell | |
| 3,879,175 A | 4/1975 | Levitt | |
| 3,912,500 A | 10/1975 | Vereschagin et al. | |
| 3,913,280 A | 10/1975 | Hall | |
| 3,916,506 A | 11/1975 | Wolf | |
| 3,929,432 A | 12/1975 | Caveney | |
| 3,941,903 A | 3/1976 | Tucker, Jr. | |
| 3,953,178 A | 4/1976 | Engel | |
| 3,958,642 A | 5/1976 | Coone | |
| 3,959,557 A | 5/1976 | Berry | |
| 3,965,935 A | 6/1976 | Morisseau | |
| 4,006,540 A | 2/1977 | Lemelson | |
| 4,029,368 A | 6/1977 | Tschirky et al. | |
| 4,054,426 A | 10/1977 | White | |
| 4,084,942 A | 4/1978 | Villalobos | |
| 4,104,441 A | 8/1978 | Fedoseev et al. | |
| 4,115,156 A | 9/1978 | Straumann | |
| 4,173,522 A | 11/1979 | Pulker et al. | |
| 4,190,301 A | 2/1980 | Lachonius et al. | |
| 4,228,142 A | 10/1980 | Holcombe, Jr. et al. | |
| 4,241,135 A | 12/1980 | Lee et al. | |
| 4,252,856 A | 2/1981 | Sara | |
| 4,260,203 A | 4/1981 | Garner | |
| 4,264,682 A | 4/1981 | Fuyama et al. | |
| 4,268,569 A | 5/1981 | Hale | |
| 4,269,899 A | 5/1981 | Fuyama et al. | |
| 4,273,592 A | 6/1981 | Kelly | |
| 4,304,984 A | 12/1981 | Bolotnikov et al. | |
| 4,313,769 A | 2/1982 | Frelin et al. | |
| 4,325,403 A | 4/1982 | Uhlmann | |
| 4,327,758 A | 5/1982 | Uhlmann | |
| 4,338,140 A | 7/1982 | Reghi | |
| 4,339,312 A | 7/1982 | Brooks et al. | |
| 4,345,798 A | 8/1982 | Cortes | |
| 4,347,083 A | 8/1982 | Sara | |
| 4,367,130 A | 1/1983 | Lemelson | |
| 4,370,177 A | 1/1983 | Frelin et al. | |
| 4,378,029 A | 3/1983 | Parkison | |
| 4,385,880 A | 5/1983 | Lemelson | |
| 4,394,400 A | 7/1983 | Green et al. | |
| 4,396,458 A | 8/1983 | Platter et al. | |
| 4,402,744 A | 9/1983 | Sara | |
| 4,410,054 A | 10/1983 | Nagel et al. | |
| 4,419,416 A | 12/1983 | Gupta et al. | |
| 4,434,188 A | 2/1984 | Kamo et al. | |
| 4,445,982 A * | 5/1984 | Royer | 205/120 |
| 4,447,503 A | 5/1984 | Dardi et al. | |
| 4,449,989 A | 5/1984 | Sarin et al. | |
| 4,468,138 A | 8/1984 | Nagel | |
| 4,490,229 A | 12/1984 | Mirtich et al. | |
| 4,504,519 A | 3/1985 | Zelez | |
| 4,524,106 A | 6/1985 | Flasck | |
| 4,532,149 A | 7/1985 | McHargue | |
| 4,540,636 A | 9/1985 | Mac Iver et al. | |
| 4,545,955 A | 10/1985 | Dickson | |
| 4,554,208 A | 11/1985 | Mac Iver et al. | |
| 4,556,607 A | 12/1985 | Sastri | |
| RE32,106 E | 4/1986 | Lemelson | |
| RE32,121 E | 4/1986 | Gupta et al. | |
| 4,583,243 A | 4/1986 | Diemer et al. | |
| 4,585,481 A | 4/1986 | Gupta et al. | |
| 4,594,220 A | 6/1986 | Hasker et al. | |
| 4,594,294 A | 6/1986 | Eichen et al. | |
| 4,597,844 A | 7/1986 | Hiraki et al. | |
| 4,608,243 A | 8/1986 | Sproul | |
| 4,610,577 A | 9/1986 | Spensberger | |
| 4,615,865 A | 10/1986 | Duvall et al. | |
| 4,618,505 A | 10/1986 | Mac Iver et al. | |
| 4,620,601 A | 11/1986 | Nagel | |
| 4,621,031 A | 11/1986 | Scruggs | |
| 4,661,213 A | 4/1987 | Dorsett et al. | |
| 4,663,183 A | 5/1987 | Ovshinsky et al. | |
| 4,666,318 A | 5/1987 | Harrison | |
| 4,698,256 A | 10/1987 | Giglia et al. | |
| 4,698,266 A | 10/1987 | Buljan et al. | |
| 4,699,082 A | 10/1987 | Hakim | |
| 4,702,808 A | 10/1987 | Lemelson | |
| 4,707,384 A | 11/1987 | Schachner et al. | |
| 4,708,037 A | 11/1987 | Buljan et al. | |
| 4,708,496 A | 11/1987 | McPherson | |
| 4,708,888 A | 11/1987 | Mitchell et al. | |
| 4,714,660 A | 12/1987 | Gates, Jr. | |
| 4,720,199 A | 1/1988 | Geczy et al. | |
| 4,720,349 A | 1/1988 | Kobayashi et al. | |
| 4,725,345 A | 2/1988 | Sakamoto et al. | |
| 4,729,440 A | 3/1988 | Hall | |
| 4,731,169 A | 3/1988 | Lipsztajn | |
| 4,732,364 A | 3/1988 | Seger et al. | |
| 4,732,491 A | 3/1988 | Geczy | |
| 4,734,339 A | 3/1988 | Schachner et al. | |
| 4,755,237 A | 7/1988 | Lemelson | |
| 4,756,631 A | 7/1988 | Jones | |
| 4,758,280 A * | 7/1988 | Bergmann et al. | 106/286.4 |
| 4,761,217 A | 8/1988 | Dorsett et al. | |
| 4,764,036 A | 8/1988 | McPherson | |
| 4,764,434 A | 8/1988 | Aronsson et al. | |
| 4,767,608 A | 8/1988 | Matsumoto et al. | |
| 4,773,974 A | 9/1988 | Dobosz | |
| 4,773,975 A | 9/1988 | Lipsztajn | |
| 4,776,862 A | 10/1988 | Wiand | |
| 4,778,730 A | 10/1988 | Zucker | |
| 4,780,337 A | 10/1988 | Seyferth et al. | |
| 4,783,368 A | 11/1988 | Yamamoto et al. | |
| 4,791,017 A | 12/1988 | Hofmann et al. | |
| 4,797,009 A | 1/1989 | Yamazaki | |
| 4,801,513 A | 1/1989 | Duhl et al. | |
| 4,803,127 A | 2/1989 | Hakim | |
| 4,806,215 A | 2/1989 | Twardowski | |
| 4,816,286 A | 3/1989 | Hirose | |
| 4,816,291 A | 3/1989 | Desphandey et al. | |
| 4,816,682 A | 3/1989 | Levitt et al. | |
| 4,822,355 A | 4/1989 | Bhuvaneshwar | |
| 4,824,262 A | 4/1989 | Kamigaito et al. | |
| 4,829,655 A | 5/1989 | Cornelison et al. | |
| 4,832,993 A | 5/1989 | Coulon | |
| 4,837,056 A | 6/1989 | Easley | |
| 4,837,089 A | 6/1989 | Araki et al. | |
| 4,842,937 A | 6/1989 | Meyer et al. | |
| 4,842,945 A | 6/1989 | Ito et al. | |
| 4,849,199 A | 7/1989 | Pinneo | |
| 4,849,290 A | 7/1989 | Fujimori et al. | |
| 4,853,096 A | 8/1989 | Lipsztajn et al. | |
| 4,859,493 A | 8/1989 | Lemelson | |
| 4,874,596 A | 10/1989 | Lemelson | |
| 4,882,138 A | 11/1989 | Pinneo | |

| Patent No. | Date | Inventor(s) | | Patent No. | Date | Inventor(s) |
|---|---|---|---|---|---|---|
| 4,889,195 A | 12/1989 | Kruger et al. | | 5,314,364 A | 5/1994 | Snijkers et al. |
| 4,892,420 A | 1/1990 | Kruger | | 5,314,652 A | 5/1994 | Simpson et al. |
| 4,900,628 A | 2/1990 | Ikegaya et al. | | 5,316,866 A | 5/1994 | Goldman et al. |
| 4,904,542 A | 2/1990 | Mroczkowski | | 5,320,675 A | 6/1994 | Dransfield et al. |
| 4,933,239 A | 6/1990 | Olson et al. | | 5,322,735 A | 6/1994 | Fridez et al. |
| 4,935,303 A | 6/1990 | Ikoma et al. | | 5,332,348 A | 7/1994 | Lemelson |
| 4,940,015 A | 7/1990 | Kobashi et al. | | 5,349,265 A | 9/1994 | Lemelson |
| 4,960,643 A | 10/1990 | Lemelson | | 5,352,493 A | 10/1994 | Dorfman et al. |
| 4,961,958 A | 10/1990 | Desphandey et al. | | 5,360,227 A | 11/1994 | Lemelson |
| 4,965,090 A | 10/1990 | Gärtner et al. | | 5,360,638 A | 11/1994 | Lequertier |
| 4,966,789 A | 10/1990 | Knapp et al. | | 5,364,192 A | 11/1994 | Damm et al. |
| 4,968,326 A | 11/1990 | Wiand | | 5,366,556 A | 11/1994 | Prince et al. |
| 4,973,494 A | 11/1990 | Yamazaki | | 5,370,195 A | 12/1994 | Keshavan et al. |
| 4,974,498 A | 12/1990 | Lemelson | | 5,382,293 A | 1/1995 | Kawarada et al. |
| 4,981,512 A | 1/1991 | Kapoor | | 5,388,027 A | 2/1995 | Pollock et al. |
| 4,985,229 A | 1/1991 | Obitsu et al. | | 5,391,407 A | 2/1995 | Dearnaley |
| 4,992,298 A | 2/1991 | Deutchman et al. | | 5,391,409 A | 2/1995 | Shibata et al. |
| 4,997,636 A | 3/1991 | Prins | | 5,392,982 A | 2/1995 | Li |
| 5,006,203 A | 4/1991 | Purdes | | 5,394,057 A | 2/1995 | Russell et al. |
| 5,006,207 A | 4/1991 | Peterman et al. | | 5,395,221 A | 3/1995 | Tucker, Jr. et al. |
| 5,021,628 A | 6/1991 | Lemelson | | 5,398,455 A | 3/1995 | Slavin et al. |
| 5,024,977 A | 6/1991 | Friederich et al. | | 5,401,543 A | 3/1995 | O'Neill et al. |
| 5,036,733 A | 8/1991 | Tiholiz et al. | | 5,403,399 A | 4/1995 | Kurihara et al. |
| 5,037,212 A | 8/1991 | Justman et al. | | 5,405,645 A | 4/1995 | Sevillano et al. |
| 5,040,501 A | 8/1991 | Lemelson | | 5,411,797 A | 5/1995 | Davanloo et al. |
| 5,051,300 A | 9/1991 | Rousseau | | 5,413,851 A | 5/1995 | Storer |
| 5,055,318 A | 10/1991 | Deutchman et al. | | 5,414,748 A | 5/1995 | Upadhya |
| 5,064,397 A | 11/1991 | Hasker et al. | | 5,415,704 A | 5/1995 | Davidson |
| 5,064,686 A | 11/1991 | McGeary | | 5,437,243 A | 8/1995 | Pike-Biegunski |
| 5,065,070 A | 11/1991 | Longo et al. | | 5,441,013 A | 8/1995 | Jeng et al. |
| 5,067,826 A | 11/1991 | Lemelson | | 5,449,569 A | 9/1995 | Schumm, Jr. |
| 5,068,148 A | 11/1991 | Nakahara et al. | | 5,451,307 A | 9/1995 | Bennett et al. |
| 5,070,274 A | 12/1991 | Yoshikawa et al. | | 5,456,406 A | 10/1995 | Lemelson |
| 5,075,094 A | 12/1991 | Morrish et al. | | 5,462,772 A | 10/1995 | Lemelson |
| 5,082,359 A | 1/1992 | Kirkpatrick | | 5,474,816 A | 12/1995 | Falabella |
| 5,096,352 A | 3/1992 | Lemelson | | 5,478,650 A | 12/1995 | Davanloo et al. |
| 5,098,737 A | 3/1992 | Collins et al. | | 5,516,421 A | 5/1996 | Brown et al. |
| 5,100,565 A | 3/1992 | Fujiwara et al. | | 5,529,815 A | 6/1996 | Lemelson |
| 5,104,634 A | 4/1992 | Calcote | | 5,533,347 A | 7/1996 | Ott et al. |
| 5,114,745 A | 5/1992 | Jones | | 5,534,293 A | 7/1996 | Wisneskie |
| 5,124,179 A | 6/1992 | Garg et al. | | 5,541,003 A | 7/1996 | Nakayama et al. |
| 5,124,998 A | 6/1992 | Arrigoni et al. | | 5,541,016 A | 7/1996 | Schumm, Jr. |
| 5,126,274 A | 6/1992 | Mc Iver et al. | | 5,543,684 A | 8/1996 | Kumar et al. |
| 5,131,941 A | 7/1992 | Lemelson | | 5,549,764 A | 8/1996 | Biltgen et al. |
| 5,132,105 A | 7/1992 | Remo | | 5,551,903 A | 9/1996 | Kumar et al. |
| 5,132,587 A | 7/1992 | Lemelson | | 5,552,675 A | 9/1996 | Lemelson |
| 5,135,808 A | 8/1992 | Kimock et al. | | 5,554,415 A | 9/1996 | Turchan et al. |
| 5,135,941 A | 8/1992 | Djuric et al. | | 5,571,572 A | 11/1996 | Sandhu |
| 5,137,398 A | 8/1992 | Omori et al. | | 5,582,635 A | 12/1996 | Czech et al. |
| 5,139,621 A | 8/1992 | Alexander et al. | | 5,589,232 A | 12/1996 | Simpson |
| 5,154,970 A | 10/1992 | Kaplan et al. | | 5,593,234 A | 1/1997 | Liston |
| 5,158,695 A | 10/1992 | Yashchenko et al. | | 5,599,385 A | 2/1997 | Czech et al. |
| 5,161,728 A | 11/1992 | Li | | 5,601,966 A | 2/1997 | Kumar et al. |
| 5,164,051 A | 11/1992 | Komaki et al. | | 5,602,679 A | 2/1997 | Dolgoff et al. |
| 5,185,179 A | 2/1993 | Yamazaki et al. | | 5,609,683 A | 3/1997 | Pike-Biegunski |
| 5,190,823 A | 3/1993 | Anthony et al. | | 5,616,372 A | 4/1997 | Conley et al. |
| 5,205,188 A | 4/1993 | Repenning et al. | | 5,616,373 A | 4/1997 | Karner et al. |
| 5,224,969 A | 7/1993 | Chen et al. | | 5,626,963 A | 5/1997 | Hirano et al. |
| 5,225,366 A | 7/1993 | Yoder | | 5,628,881 A | 5/1997 | Lemelson |
| 5,232,568 A | 8/1993 | Parent et al. | | 5,629,086 A | 5/1997 | Hirano et al. |
| 5,237,967 A | 8/1993 | Willermet et al. | | 5,633,087 A | 5/1997 | Simpson |
| 5,239,746 A | 8/1993 | Goldman | | 5,643,423 A | 7/1997 | Kimock et al. |
| 5,242,741 A | 9/1993 | Sugiyama et al. | | 5,644,130 A | 7/1997 | Raatz |
| 5,245,104 A | 9/1993 | Cullick | | 5,645,601 A | 7/1997 | Pope et al. |
| 5,246,035 A | 9/1993 | Skyllingstad et al. | | 5,645,900 A | 7/1997 | Ong et al. |
| 5,249,554 A | 10/1993 | Tamor et al. | | 5,648,620 A | 7/1997 | Stenzel et al. |
| 5,254,397 A | 10/1993 | Kawai et al. | | 5,662,965 A | 9/1997 | Deguchi et al. |
| 5,254,499 A | 10/1993 | Sandhu et al. | | 5,669,144 A | 9/1997 | Hahn et al. |
| 5,255,929 A | 10/1993 | Lemelson | | 5,679,404 A | 10/1997 | Patten, Jr. et al. |
| 5,257,558 A | 11/1993 | Farzin-Nia et al. | | 5,686,152 A | 11/1997 | Johnson et al. |
| 5,258,687 A | 11/1993 | Duggan et al. | | 5,688,557 A | 11/1997 | Lemelson et al. |
| 5,264,757 A | 11/1993 | Snijkers et al. | | 5,688,677 A | 11/1997 | Ebert et al. |
| 5,281,274 A | 1/1994 | Yoder | | 5,702,288 A | 12/1997 | Liebke et al. |
| 5,283,109 A | 2/1994 | Kaplan et al. | | 5,705,271 A | 1/1998 | Okamura et al. |
| 5,284,394 A | 2/1994 | Lemelson | | 5,708,328 A | 1/1998 | Mathews et al. |
| 5,284,685 A | 2/1994 | Rousseau | | 5,714,202 A | 2/1998 | Lemelson et al. |
| 5,288,556 A | 2/1994 | Lemelson | | 5,718,976 A | 2/1998 | Dorfman et al. |
| 5,292,594 A | 3/1994 | Liburdi et al. | | 5,725,573 A | 3/1998 | Dearnaley et al. |
| 5,300,942 A | 4/1994 | Dolgoff | | 5,728,465 A | 3/1998 | Dorfman et al. |

| | | |
|---|---|---|
| 5,740,941 A | 4/1998 | Lemelson |
| 5,747,118 A | 5/1998 | Bunshah et al. |
| 5,763,072 A | 6/1998 | Kato et al. |
| 5,763,087 A | 6/1998 | Falabella |
| 5,782,980 A | 7/1998 | Allen et al. |
| 5,786,038 A | 7/1998 | Conley et al. |
| 5,786,068 A | 7/1998 | Dorfman et al. |
| 5,794,801 A | 8/1998 | Lemelson |
| 5,799,549 A | 9/1998 | Decker et al. |
| 5,815,226 A | 9/1998 | Yamazaki et al. |
| 5,824,365 A | 10/1998 | Sandhu et al. |
| 5,824,367 A | 10/1998 | Park et al. |
| 5,827,613 A | 10/1998 | Nakayama et al. |
| 5,829,735 A | 11/1998 | Ikeda |
| 5,836,905 A | 11/1998 | Lemelson et al. |
| 5,837,394 A | 11/1998 | Schumm, Jr. |
| 5,840,132 A | 11/1998 | Erdemir et al. |
| 5,849,413 A | 12/1998 | Zhu et al. |
| 5,853,839 A | 12/1998 | Schmeisser |
| 5,857,888 A | 1/1999 | Tada et al. |
| 5,866,195 A | 2/1999 | Lemelson |
| 5,871,805 A | 2/1999 | Lemelson |
| 5,876,793 A | 3/1999 | Sherman et al. |
| 5,879,532 A | 3/1999 | Foster et al. |
| 5,900,982 A | 5/1999 | Dolgoff et al. |
| 5,902,563 A | 5/1999 | Pinneo |
| 5,922,478 A | 7/1999 | Welty et al. |
| 5,927,325 A | 7/1999 | Bensaoula et al. |
| 5,934,321 A | 8/1999 | Miya et al. |
| 5,935,323 A | 8/1999 | Tanga et al. |
| 5,940,975 A | 8/1999 | Decker et al. |
| 5,945,656 A | 8/1999 | Lemelson et al. |
| 5,948,548 A | 9/1999 | Welty et al. |
| 5,952,102 A | 9/1999 | Cutler |
| 5,958,268 A | 9/1999 | Engelsberg et al. |
| 5,961,719 A | 10/1999 | Buhaenko et al. |
| 5,985,451 A | 11/1999 | Senda et al. |
| 6,007,908 A | 12/1999 | Reece et al. |
| 6,048,588 A | 4/2000 | Engelsberg |
| 6,066,399 A | 5/2000 | Hirano et al. |
| 6,080,378 A | 6/2000 | Yokota et al. |
| 6,083,570 A | 7/2000 | Lemelson et al. |
| 6,086,726 A | 7/2000 | Renk et al. |
| 6,090,490 A | 7/2000 | Mokerji |
| 6,099,639 A | 8/2000 | Thomas |
| 6,099,976 A | 8/2000 | Lemelson et al. |
| 6,118,506 A | 9/2000 | Yamazaki et al. |
| 6,132,889 A * | 10/2000 | Welty et al. .................. 428/623 |
| 6,165,616 A | 12/2000 | Lemelson et al. |
| 6,186,768 B1 | 2/2001 | Schmitt |
| 6,197,438 B1 | 3/2001 | Faulkner |
| 6,204,595 B1 | 3/2001 | Falabella |
| 6,207,281 B1 | 3/2001 | Itoh |
| 6,207,282 B1 | 3/2001 | Deguchi et al. |
| 6,221,231 B1 | 4/2001 | Foster |
| 6,274,009 B1 | 8/2001 | Krafton et al. |
| 6,287,644 B1 | 9/2001 | Jackson et al. |
| 6,287,682 B1 | 9/2001 | Grab et al. |
| 6,299,425 B1 | 10/2001 | Hirano et al. |
| 6,301,333 B1 | 10/2001 | Mearini et al. |
| 6,314,763 B1 | 11/2001 | Sakamoto |
| 6,314,764 B1 | 11/2001 | Sakamoto |
| 6,332,931 B1 | 12/2001 | Das et al. |
| 6,342,755 B1 | 1/2002 | Russ et al. |
| 6,344,282 B1 | 2/2002 | Darolia et al. |
| 6,347,905 B1 | 2/2002 | Lukschandel |
| 6,350,356 B1 | 2/2002 | Welty |
| 6,387,502 B1 | 5/2002 | Okamura et al. |
| 6,391,457 B1 | 5/2002 | Welty et al. |
| 6,399,152 B1 | 6/2002 | Goodrich |
| 6,399,219 B1 | 6/2002 | Welty et al. |
| 6,406,760 B1 | 6/2002 | Shepard, Jr. |
| 6,410,086 B1 | 6/2002 | Brandon et al. |
| 6,436,473 B2 | 8/2002 | Darolia et al. |
| 6,447,890 B1 | 9/2002 | Leverenz et al. |
| 6,458,473 B1 | 10/2002 | Conner et al. |
| 6,462,467 B1 | 10/2002 | Russ |
| 6,471,408 B1 | 10/2002 | Ikeda et al. |
| 6,475,355 B2 | 11/2002 | Mearini et al. |
| 6,478,887 B1 | 11/2002 | Sue et al. |
| 6,498,433 B1 | 12/2002 | Scott et al. |
| 6,503,373 B2 | 1/2003 | Eerden et al. |
| 6,534,903 B1 | 3/2003 | Spiro et al. |
| 6,538,378 B1 | 3/2003 | Nakano |
| 6,548,959 B1 | 4/2003 | Harada et al. |
| 6,563,256 B1 | 5/2003 | Zavadil et al. |
| 6,580,218 B2 | 6/2003 | Harada et al. |
| 6,586,114 B1 | 7/2003 | Anton |
| 6,602,356 B1 | 8/2003 | Nagaraj et al. |
| 6,604,941 B2 | 8/2003 | Billings |
| 6,612,787 B1 | 9/2003 | North et al. |
| 6,620,524 B2 | 9/2003 | Pfaendtner et al. |
| 6,632,762 B1 | 10/2003 | Zaykoski et al. |
| 6,666,983 B2 * | 12/2003 | Marietti et al. .................. 216/75 |
| 6,682,827 B1 | 1/2004 | Darolia et al. |
| 6,689,199 B2 | 2/2004 | Corderman et al. |
| 6,689,422 B1 | 2/2004 | Warnes et al. |
| 6,697,303 B2 | 2/2004 | Amano et al. |
| 6,737,148 B1 | 5/2004 | Smith |
| 6,819,349 B2 | 11/2004 | Mimura et al. |
| 6,849,308 B1 | 2/2005 | Speakman et al. |
| 6,904,935 B2 | 6/2005 | Welty et al. |
| 6,935,618 B2 | 8/2005 | Welty et al. |
| 7,153,586 B2 | 12/2006 | Welty |
| 2001/0001436 A1 | 5/2001 | Foster et al. |
| 2001/0008707 A1 | 7/2001 | Eerden et al. |
| 2001/0033950 A1 | 10/2001 | Billings |
| 2001/0038922 A1 | 11/2001 | Jonte et al. |
| 2002/0009611 A1 | 1/2002 | Darolia et al. |
| 2002/0027419 A1 | 3/2002 | Harada et al. |
| 2002/0034639 A1 | 3/2002 | Mearini et al. |
| 2002/0102403 A1 | 8/2002 | Leverenz et al. |
| 2002/0110700 A1 | 8/2002 | Hein et al. |
| 2002/0114068 A1 | 8/2002 | Kuschnereit et al. |
| 2002/0119259 A1 | 8/2002 | Kamei et al. |
| 2002/0132132 A1 | 9/2002 | Bose et al. |
| 2002/0170460 A1 | 11/2002 | Goodrich |
| 2003/0031842 A1 * | 2/2003 | Marietti et al. .................. 428/195 |
| 2003/0044535 A1 * | 3/2003 | Goobich .................. 427/256 |
| 2003/0044633 A1 | 3/2003 | Nagaraj et al. |
| 2003/0047139 A1 | 3/2003 | Corderman et al. |
| 2003/0047141 A1 | 3/2003 | Warnes et al. |
| 2003/0049374 A1 | 3/2003 | Warnes et al. |
| 2003/0118858 A1 | 6/2003 | Kushida et al. |
| 2003/0118863 A1 | 6/2003 | Darolia et al. |
| 2003/0134139 A1 | 7/2003 | Pfaendtner et al. |
| 2003/0139106 A1 | 7/2003 | Sheek et al. |
| 2003/0140856 A1 | 7/2003 | Corderman et al. |
| 2003/0180571 A1 | 9/2003 | Singh |
| 2003/0211353 A1 | 11/2003 | Tolls |
| 2003/0224201 A1 | 12/2003 | Kawakami et al. |
| 2004/0016318 A1 | 1/2004 | Angeliu |
| 2004/0076837 A1 | 4/2004 | Hein et al. |
| 2004/0093730 A1 * | 5/2004 | Miya et al. .................. 29/896.41 |
| 2004/0112237 A1 | 6/2004 | Chaug et al. |
| 2004/0142213 A1 | 7/2004 | Chen et al. |
| 2004/0185182 A1 | 9/2004 | Lipkin et al. |
| 2007/0026205 A1 | 2/2007 | Anton et al. |
| 2008/0264903 A1 | 10/2008 | Anton et al. |

FOREIGN PATENT DOCUMENTS

| | | |
|---|---|---|
| DE | 38 28946 A1 | 3/1989 |
| DE | 10 2004 060 481 A1 | 6/2006 |
| EP | 0032306 B1 | 7/1981 |
| EP | 0047363 B1 | 3/1982 |
| EP | 0082515 B2 | 6/1983 |
| EP | 0107142 B1 | 5/1984 |
| EP | 0117542 B1 | 9/1984 |
| EP | 0121314 B1 | 10/1984 |
| EP | 0127229 B1 | 12/1984 |
| EP | 0179513 B1 | 4/1986 |
| EP | 0 265 533 A1 | 10/1986 |
| EP | 0 361 206 A1 | 10/1986 |
| EP | 0236961 B1 | 9/1987 |
| EP | 0266127 B1 | 5/1988 |
| EP | 0266128 A2 | 5/1988 |
| EP | 0266129 A2 | 5/1988 |
| EP | 0267704 A1 | 5/1988 |

| | | | |
|---|---|---|---|
| EP | 0283910 A2 | 9/1988 |
| EP | 0321087 A1 | 6/1989 |
| EP | 0328818 B1 | 8/1989 |
| EP | 0353367 B1 | 2/1990 |
| EP | 0 388 861 A2 | 3/1990 |
| EP | 0 388 861 B1 | 3/1990 |
| EP | 0 378 378 B1 | 7/1990 |
| EP | 0386386 B1 | 9/1990 |
| EP | 0390269 B1 | 10/1990 |
| EP | 0428206 A1 | 5/1991 |
| EP | 0428206 B1 | 5/1991 |
| EP | 0 462 734 A1 | 6/1991 |
| EP | 0 462 734 B1 | 6/1991 |
| EP | 0435039 B1 | 7/1991 |
| EP | 0 509 630 A2 | 2/1992 |
| EP | 0 519 472 A3 | 6/1992 |
| EP | 0 519 472 B1 | 6/1992 |
| EP | 0 520 566 A1 | 6/1992 |
| EP | 0 520 566 B1 | 6/1992 |
| EP | 0 520 567 A1 | 6/1992 |
| EP | 0 520 832 B1 | 6/1992 |
| EP | 0492763 A1 | 7/1992 |
| EP | 0 611 331 B1 | 11/1992 |
| EP | 0 603 422 B1 | 12/1992 |
| EP | 0519643 B1 | 12/1992 |
| EP | 0532150 A1 | 3/1993 |
| EP | 0535796 B1 | 4/1993 |
| EP | 0564709 B1 | 10/1993 |
| EP | 0 605 814 B1 | 12/1993 |
| EP | 0581423 A1 | 2/1994 |
| EP | 0581423 B1 | 2/1994 |
| EP | 0583122 A1 | 2/1994 |
| EP | 0 632 344 A2 | 5/1994 |
| EP | 0 632 344 B1 | 5/1994 |
| EP | 0604096 A1 | 6/1994 |
| EP | 0604096 B1 | 6/1994 |
| EP | 0 676 902 A2 | 3/1995 |
| EP | 0 730 129 A2 | 4/1995 |
| EP | 0723573 B1 | 7/1996 |
| EP | 0761386 B1 | 3/1997 |
| EP | 0 884 509 A1 | 6/1997 |
| EP | 0780564 A2 | 6/1997 |
| EP | 0 826 798 A3 | 8/1997 |
| EP | 0798572 A1 | 10/1997 |
| EP | 0821078 B1 | 1/1998 |
| EP | 0834191 B1 | 4/1998 |
| EP | 1008672 A1 | 6/2000 |
| EP | 1061553 A1 | 12/2000 |
| EP | 1067580 B1 | 1/2001 |
| EP | 1111091 A1 | 6/2001 |
| EP | 1197577 A2 | 4/2002 |
| EP | 1197583 A1 | 4/2002 |
| EP | 1209247 A1 | 5/2002 |
| EP | 1314790 A2 | 5/2003 |
| EP | 1321541 A2 | 6/2003 |
| EP | 1329536 A1 | 7/2003 |
| GB | 2 167 774 A | 6/1986 |
| JP | 57-106513 A | 7/1982 |
| JP | 60-195094 A | 10/1985 |
| JP | 61-106494 A | 5/1986 |
| JP | 61-124573 A | 6/1986 |
| JP | 62-72921 A | 4/1987 |
| JP | 62-196371 A | 8/1987 |
| JP | 03-223190 A | 2/1991 |
| JP | 03-226556 | 10/1991 |
| JP | 03-277785 | 12/1991 |
| JP | 04-026755 | 1/1992 |
| JP | 04-165170 A | 10/1992 |
| JP | 5-200964 | 8/1993 |
| WO | WO 86/06758 A1 | 4/1986 |
| WO | WO 90/05701 A1 | 11/1989 |
| WO | WO 92/01314 A1 | 7/1990 |
| WO | WO 92/15082 A1 | 2/1992 |
| WO | WO 96/01913 A1 | 7/1995 |
| WO | WO 99/33760 A1 | 7/1999 |

OTHER PUBLICATIONS

Response dated Mar. 27, 2008 to Canadian Office Action for Canadian Application No. 2,549,981, 15 pages.
Canadian Office Action dated Jul. 28, 2008 for Canadian Application No. 2,549,981, 2 pages.
Response to Canadian Office Action dated Jan. 23, 2009 for Canadian Application No. 2,549,981, 10 pages.
Canadian Office Action dated Jun. 9, 2009 in Canadian Patent Application No. 2,549,981, 2 pages.
Chinese Office Action dated Dec. 5, 2008 in Chinese Patent Application No. 200610107464.8, 12 pages.
European Communication dated May 28, 2008 with extended search report in European Patent Application No. 06014962.2, 16 pages.
European Communication dated Nov. 13, 2008 with Search Report in European Patent Application No. 06014962.2, 17 pages.
Response dated Mar. 20, 2009 to European Communication in European Patent Application No. 06014962.2, 14 pages.
Non-Final Office Action dated Jun. 24, 2008 for U.S. Appl. No. 11/194,222, 11 pages.
Response dated Sep. 23, 2008 to U.S. Non-Final Office for U.S. Appl. No. 11/194,222, 11 pages.
Final Rejection dated Dec. 9, 2009 for U.S. Appl. No. 11/194,222, 13 pages.
Response dated Mar. 9, 2009 to Final Rejection and Request for Continued Examination for U.S. Appl. No. 11/194,222, 16 pages.
Non-Final Rejection dated May 13, 2009 for U.S. Appl. No. 11/194,222, 13 pages.
Response dated Aug. 13, 2009 to Non-Final Office Action for U.S. Appl. No. 11/194,222, 15 pages.
Advisory Action dated Mar. 8, 2010 for U.S. Appl. No. 11/194,222, 5 pages.
Canadian Office Action dated Apr. 20, 2010 for Canadian Application No. 2,549,981, 3 pages.
Canadian Office Action dated Feb. 12, 2010 for Canadian Patent Application No. 2,634,297, 6 pages.
U.S. Appl. No. 10/322,871, titled "Valve Component With Multiple Surface Layers," by Welty et al., filed Dec. 18, 2002.
U.S. Appl. No. 10/741,848, titled "Valve Component With Multiple Surface Layers," by Welty et al., filed Dec. 18, 2003.
U.S. Appl. No. 10/633,245, titled "Article With Scandium Compound Decorative Coating," by Richard P. Welty, filed Aug. 1, 2003.
Final Rejection dated Nov. 24, 2009 for U.S. Appl. No. 11/194,222, 15 pages.
Response dated Feb. 24, 2010 to Final Rejection for U.S. Appl. No. 11/194,222, 14 pages.
Response dated May 8, 2008 to U.S. Restriction Requirement for U.S. Appl. No. 11/194,222, 8 pages.
Response to Canadian Office Action dated Dec. 8, 2009 for Canadian Application No. 2,549,981, 4 pages.
Restriction Requirement dated Apr. 29, 2008 for U.S. Appl. No. 11/194,222, 7 pages.
Office Action for U.S. Appl. No. 11/194,222, mail date Sep. 3, 2010, 11 pages.
Amendment and Reply for U.S. Appl. No. 11/194,222, filed Dec. 3, 2010, 11 pages.
Partial European Search Report for EP Application No. 06014962.2, mail date Feb. 18, 2008, 11 pages.
European Patent Office Communication regarding EP Application No. 06014962, mail date Sep. 27, 2010, 4 pages.
Office Action (Non-Final) for U.S. Appl. No. 11/194,222, dated Sep. 6, 2011, 11 pages.
Extended European Search Report for Application No. EP 06 01 4962, dated Feb. 28, 2008, 16 pages.

* cited by examiner

METHOD OF PRODUCING AN ARTICLE HAVING PATTERNED DECORATIVE COATING

CROSS-REFERENCE TO RELATED PATENT APPLICATIONS

The present application is a Divisional of U.S. patent application Ser. No. 11/194,222 filed Aug. 1, 2005, the entire disclosure of which is incorporated herein by reference.

BACKGROUND

The present invention relates generally to articles having decorative coatings or finishes provided thereon and methods of producing such articles. More specifically, the present invention relates to articles and methods for producing articles which have multi-tone coatings provided thereon.

Colored coatings have been provided on articles using physical vapor deposition (PVD) or chemical vapor deposition (CVD) methods. PVD coatings are at present available in a range of colors on such commercial products as plumbing products, home hardware such as doorknobs and hinges, automotive products, recreational products, and various other products.

PVD and CVD decorative coatings in general offer many performance advantages such as high hardness, abrasion resistance, corrosion resistance, chemical resistance, etc. as compared to conventional polymer and electroplated coatings. Although PVD and CVD coatings are available in a variety of colors, presently available PVD and CVD coatings generally have a uniform color over the entire substrate surface. It may be desirable, however, for certain applications to use a PVD or CVD coating having a visibly-patterned, multi-color appearance (e.g., for creating products having, for example, streaked, speckled, marbled, "antique", "aged", or "distressed" finishes, or having decorative or informational digitized images incorporated into the surface finish).

Conventional methods for creating patterned decorative finishes on products such as those mentioned above generally utilize polymer coatings for either coloration or protection. It is known to use paints, lacquers, etc. to create patterned finishes directly on a substrate surface. It is also known to thermally, chemically, and/or mechanically treat substrate surfaces to produce patterned finishes, but such treated surfaces are often not durable and require a polymer topcoat for protection against abrasion and corrosion. Polymer coatings may be susceptible to abrasion, solvents, and household chemicals, and may develop pinholes through which corrosion of the substrate can initiate.

PVD coatings, in contrast, are generally very hard and resistant to abrasion and chemical attack, and are superior to polymer-based coatings for many applications. While patterned PVD and CVD coatings have been used in the electronics industry for purposes of fabricating printed and integrated circuits, such coatings have not conventionally been used to provide decorative coatings (e.g., visibly-patterned, multi-colored decorative coatings). Such patterned PVD and CVD coatings are generally made of materials selected for their electronic (as opposed to decorative) properties and are used to produce non-decorative patterns that are too small to be visible to the human eye without magnification. In addition, such patterning processes often handle only flat substrates and a single substrate at a time, which would be unsuitable for the mass-production of consumer products.

It would be advantageous to provide a decorative coating or finish for an article that is provided using PVD and/or CVD methods that has a patterned appearance, which will not rub or scrub off in normal use, which is scratch and corrosion resistant, can withstand common household chemicals and solvents, and does not age or degrade in sunlight or under exposure to outdoor conditions. It would also be advantageous to provide articles having decorative coatings which provide an aesthetically-pleasing appearance that is visible to the unaided human eye and that are produced using methods which are suitable for mass-production. It would be desirable to provide coatings, articles, and methods which exhibit any one or more of these or other advantageous features as may be understood by those of ordinary skill in the art reviewing this document.

SUMMARY

An exemplary embodiment relates to a method for producing an article having a decorative coating includes depositing at least a first coating layer onto at least a portion of a substrate using a physical or chemical vapor deposition method in a vacuum chamber at sub-atmospheric pressure, the first coating layer comprising a first material having a first color. The method also includes patterning the first coating layer using a non-uniform patterning process to form a patterned coating layer having penetrations through which a portion of an underlying surface is visible, the underlying surface comprising a second material and having a second color that is visually contrasting to the first color. The patterned first coating layer comprises a decorative pattern comprising features distinguishable by an unaided human eye.

Another exemplary embodiment relates to a method for producing an article having a decorative surface that includes depositing a first layer of material on a substrate using a vapor deposition method, the first layer of material comprising a first material having a first color. The method also includes patterning the first layer of material using a non-uniform patterning process to remove portions of the first layer of material to form apertures extending through the first layer to reveal an underlying second material having a second color different from the first color. The step of patterning the first layer of material forms a decorative pattern on the article.

DETAILED DESCRIPTION OF EXEMPLARY EMBODIMENTS

Figure 1:
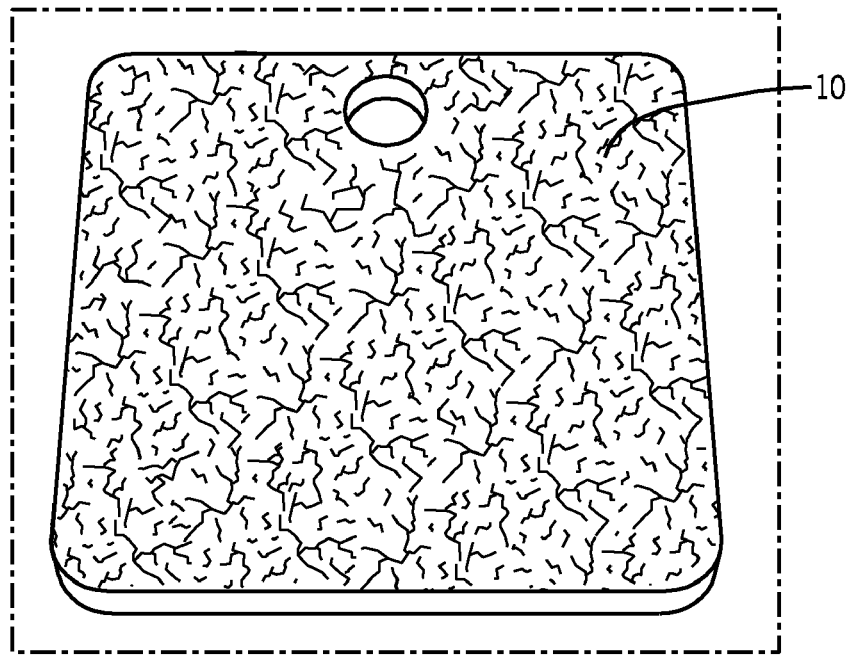
FIG. 1 is a photograph of an article having a decorative coating provided thereon according to an exemplary embodiment.

According to an exemplary embodiment, an article or product is provided that includes a decorative coating with a visibly-patterned, multi-colored appearance provided thereon. Any of a variety of articles or products may be produced using the methods described below in the various exemplary embodiments, including, but not necessarily limited to, plumbing components (e.g., faucets, handles, nozzles, sinks, drain flanges, stop valves, pipes, tub drains, etc.), home hardware (e.g., doorknobs, hinges, drawer/cabinet pulls, etc.), bath hardware (towel bars, safety "grab" bars, etc.), windows and doors (e.g., shower doors, etc.), automotive products (e.g., automotive trim parts, emblems, wheel covers, etc.), knives, medical instruments, tableware, recreational products, sporting goods (e.g., golf clubs, ice skates, etc.), indoor or outdoor lighting products (e.g., lamps, fixtures, etc.) weatherproof informational signs, and any of a variety of other products or articles. It should be noted that the present invention does not pertain to microprocessors or the fabrication of electronic chips and the like.

According to one exemplary embodiment, at least one coating or layer of material is provided (e.g., deposited using a PVD and/or CVD process) on a substrate, after which a masking material is applied on top of the coating. The masking material is then patterned by a random or non-uniform modification process, forming penetrations (e.g., apertures or holes) which leave a portion of the underlying coating exposed. The exposed portion of the coating is subsequently removed by chemical etching, leaving randomly or non-uniformly arranged penetrations through which an underlying coating layer or substrate surface having a contrasting color is visible.

In this manner, an article having a decorative coating with a visibly-patterned multi-colored appearance may be provided that includes at least one coating material deposited on a substrate by a vacuum deposition process. According to various exemplary embodiments, the at least one coating may be provided (e.g., deposited) by a PVD technique such as cathodic arc evaporation or sputtering, or by a CVD method such as hot-filament or ion-beam PECVD.

The coating may be patterned by etching, using the patterned masking layer which is resistant to the etching process, to remove the coating in areas unprotected by the mask. The masking layer is subsequently removed using a solvent, uncovering the un-etched regions of the coating surface. The coating material is selected to have a color which is visually contrasting to the underlying surface exposed by the etching process. Regions of contrasting color may alternatively be produced by anodizing or otherwise chemically or physically modifying the unmasked regions of the coating in such a way as to produce regions having a color contrasting from that of the masked regions. The underlying surface may be the substrate surface, or may be an underlying coating layer selected to have a desired decorative appearance and/or to provide other desired properties.

According to other exemplary embodiments, the coating may be patterned by providing the coating on top of a patterned masking layer having penetrations which expose a portion of the substrate surface (or a surface of another underlying layer). After providing the coating, the masking layer is dissolved in a solvent, thereby loosening and removing the coating material deposited on top of the masking material while leaving in place the coating deposited on the portion of the substrate surface exposed through the penetrations in the masking layer. This latter type of process may be referred to as a "lift-off" process.

The patterned masking layer that may be used for either an etching or a lift-off process may be formed by depositing a layer of a masking material non-uniformly on a substrate, as by stenciling, or by depositing the masking material uniformly over the substrate surface and subsequently patterning it by a non-uniform removal process such as barrel tumbling in finishing media, which removes portions of the masking layer, forming penetrations (e.g., apertures or holes) through which portions of the underlying surface is exposed. A variety of methods for forming decoratively-patterned masking layers according to the various exemplary embodiments will be described below in more detail.

As used herein, the term "substrate" refers to all or a portion of an article underlying the decorative coating, and may include any surface protection or preparation layers such as electroplating or polymer basecoats. According to various exemplary embodiments, the substrate may include materials such as metals (e.g., brass, zinc, stainless steel, tin, copper, iron-based alloys, etc.), plastics (e.g., thermoset or thermoplastic materials such as a polyolefin or acrylonitrile-butadiene-styrene (ABS) material, etc.), ceramics, glasses (e.g., architectural type glass (e.g., shower doors, etc.), and/or composites (e.g., metal matrix materials, polymer matrix materials, ceramic and glass matrix materials, carbon graphite matrix materials, fiber reinforced composites, and the like).

Substrates may be electroplated with corrosion-resistant and/or surface-leveling layers comprising, for example, nickel, chromium, copper, cobalt, zinc, cadmium, tin, lead, gold, brass, bronze, rhodium, platinum, nickel-tin alloys, and other known electroplating materials. Substrates may also include protective and/or surface-leveling polymer layers, anodized layers of the substrate material or of an applied coating, or any other known surface-preparation material that is compatible with vacuum deposition and patterning processes.

The term "decorative coating" as used herein refers to coatings that provide a desired surface appearance to an article (e.g., to coatings that have a patterned, multi-colored visual appearance). In some embodiments, in addition to providing a desired surface appearance, the decorative coating may also provide various utilitarian features such as some degree of abrasion, scratch, tarnish, and/or corrosion resistance to an underlying substrate. Such coatings may also be employed for other functional purposes, such as to increase the strength of a cutting edge or to improve the wear resistance of a surface (e.g., in cases in which the appearance of the coating contributes to its consumer marketing appeal).

The terms "pattern" and "patterned" refer to a coating or mask comprising a layer that has penetrations (e.g., apertures or holes) through which an underlying coating layer or substrate of a different (e.g., contrasting) color is visible. The term "visibly-patterned" refers to a patterned coating or layer in which at least some features (regions) of the pattern are of sufficient size and/or have sufficient color contrast from surrounding features to be readily distinguished by a human eye without magnification, for example, but without limitation, features larger than around 1 mm extent in least one linear dimension. Such visible features may also be made up of smaller dots or shaped pixels which are individually indistinguishable to a human eye, but which together form distinguishable features. The term "decorative pattern" refers to a pattern selected at least in part to have a desired aesthetically-appealing appearance. The term "informational pattern" refers to a pattern selected to provide a visually distinguishable display of text or of a digitized image, which may also be decorative.

The terms "random" and "non-uniform" when used herein to refer to the arrangement of apertures or holes formed in a layer of material is intended to mean an arrangement in which the specific locations of apertures or holes is not predetermined prior to patterning. Various techniques for obtaining such random or non-uniform arrangements are described below in greater detail. Such arrangements are unlike those used, for example, in masks used in the manufacture of microprocessors and the like, which have a set or predetermined pattern when provided on a wafer or the like (e.g., so that features such as conductive lines, vias, and the like will line up properly to provide the desired functionality).

It should be understood by those reviewing this disclosure that larger distinguishable patterns (e.g., an image of an animal) may be formed while using random patterning techniques. For example, a substrate may be covered with a mask having a cutout formed therein. The cutout may have a desired shape (e.g., an image of an animal). The portion of the substrate not covered by the mask (corresponding to the cutout) may be patterned in a random or non-uniform fashion to have apertures extending through the substrate. When the mask is removed, the portion covered by the mask will not be patterned (e.g., will not have apertures extending therethrough) and the portion of the substrate not covered by the mask will have random or non-uniform patterning therein. An observer of the substrate will then see an image (e.g., an animal) defined by the random or non-uniform patterning.

The term "contrasting color" refers to a second color which is visually distinguishable from a first color by an unaided human eye under normal outdoor or indoor lighting conditions.

Figure 2:
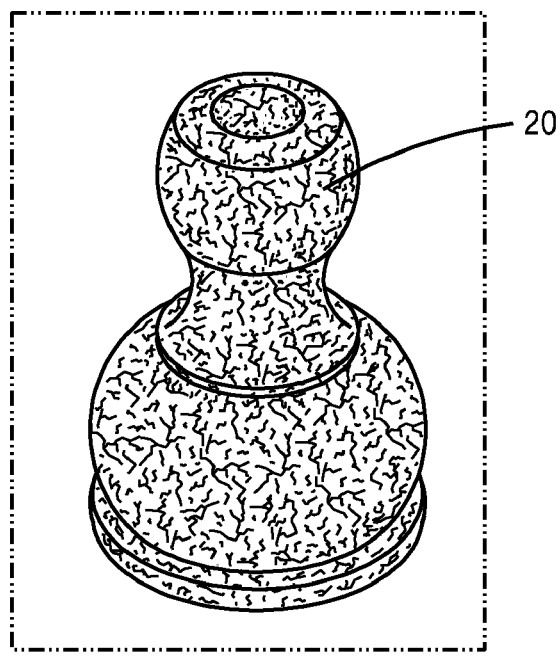
FIG. 2 is a photograph of an article having a decorative coating provided thereon according to an exemplary embodiment.
Figure 3:
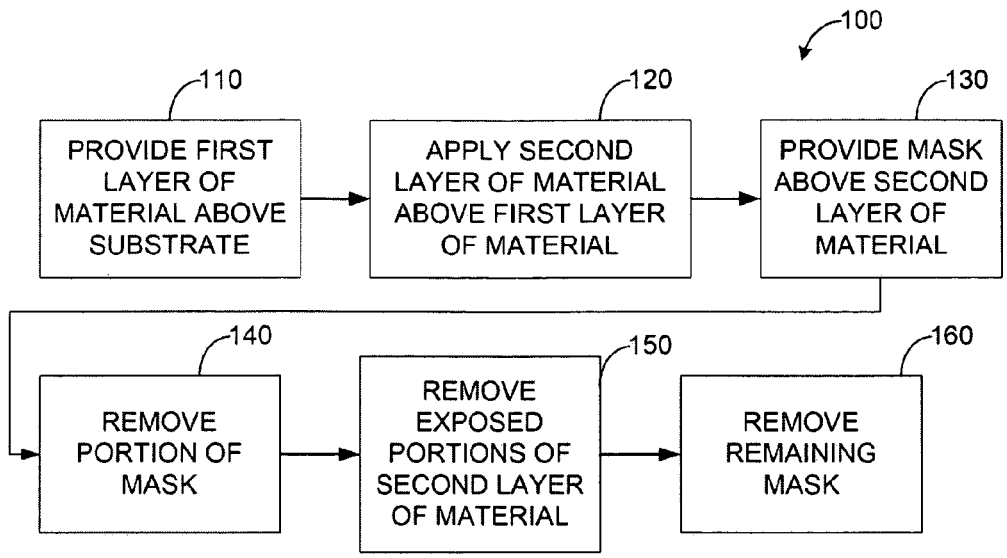
FIG. 3 is a flow diagram illustrating steps in a method of producing an article having a decorative coating according to an exemplary embodiment.

FIGS. 1 and 2 are photographs of articles 10 and 20 produced using a method 100 for providing decorative coatings or finishes according to an exemplary embodiment. FIG. 3 is a flow diagram illustrating exemplary steps of method 100, and FIGS. 4-9 are schematic cross-sectional views of an article 200 illustrating the steps in method 100.

Figure 4:
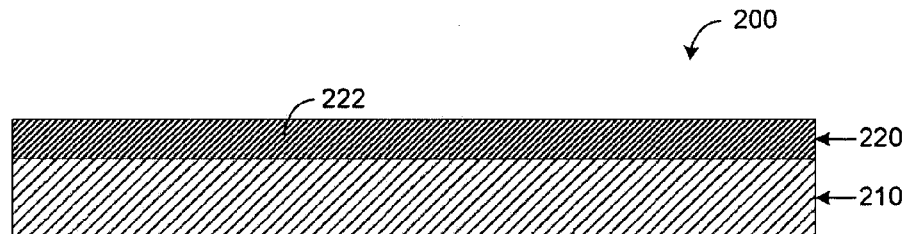
FIGS. 4-9 are schematic cross-sectional views of a portion of an article having a decorative coating provided thereon illustrating steps in the exemplary method represented by the flow diagram of FIG. 3.

In a step 110 shown in FIG. 4, a first layer or coating 220 comprising a material 222 is provided on a substrate 210 comprising a material 212. According to an exemplary embodiment, material 222 is a relatively dark-colored material. For example, material 222 may be an oxy-carbide or oxy-carbo-nitride of zirconium that is applied to substrate 210 using a cathodic arc evaporation process carried out in a vacuum chamber at sub-atmospheric pressure using known processes. According to another exemplary embodiment, material 222 is a diamond-like carbon (DLC) coating applied by hot-filament PECVD in a low-pressure vacuum deposition process. Various other materials may also be used for layer 220 as will be described below.

Figure 5:
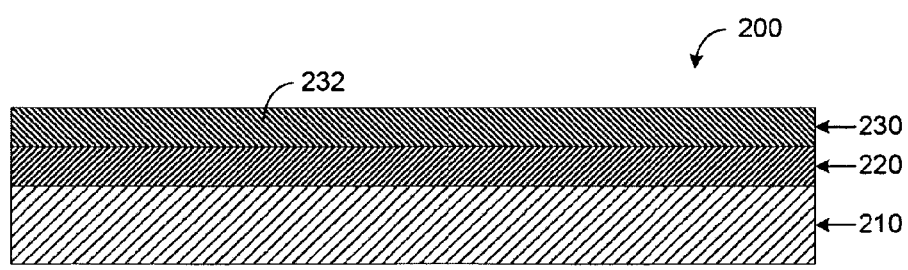

In a step 120 shown in FIG. 5, a second layer or coating 230 of material 232 is provided above layer 220. According to an exemplary embodiment, material 232 has a different color (e.g., is lighter-colored) than material 222. For example, material 232 may be a material such as zirconium nitride applied on layer 220 by cathodic arc evaporation.

According to an exemplary embodiment, layers 220 and 230 have thicknesses of between approximately 0.3 and 0.5 microns. According to other exemplary embodiments, layers greater than 0.5 microns or less than 0.3 microns thick may be employed. For example, thicker coatings (e.g., in a range from around 0.5 to 5 microns) may be utilized in cases in which the coating is required to perform some function such as scratch or corrosion protection in addition to providing a decorative appearance. It should also be noted that the thickness of layer 220 may be the same as or may differ from the thickness of layer 230 according to various exemplary embodiments.

Figure 6:
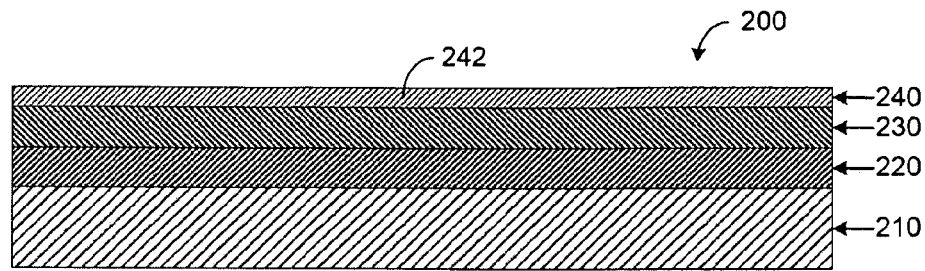

Subsequent to providing layer 230, article 200 is removed from the vacuum chamber and coated with a relatively thin mask or masking layer 240 (e.g., comprising a material 242 such as a waterproof permanent ink) in a step 130 shown in FIG. 6. According to an exemplary embodiment, layer 240 has a thickness of between approximately 0.1 microns and 0.5 microns. According to various other exemplary embodiments, the thickness of the masking layer may be between approximately 0.01 microns and 50 microns.

Figure 7:
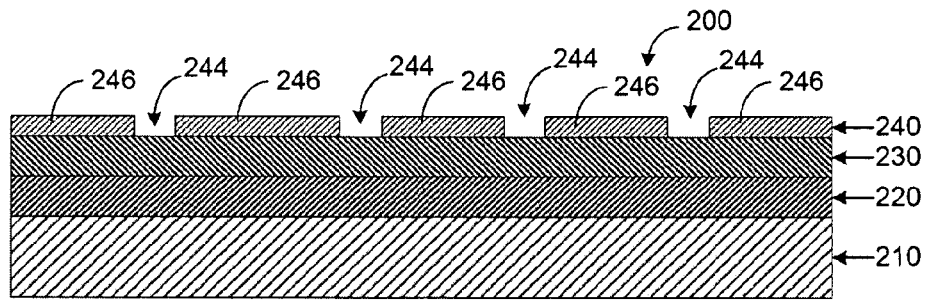

In a step 140 shown in FIG. 7, a portion of layer 240 is removed (e.g., layer 240 is randomly or non-uniformly patterned). According to an exemplary embodiment, article 200 is placed in a barrel-tumbler with plastic tumbling media and tumbled until layer 240 is partially, but not totally, removed and a portion of layer 230 is exposed. For example, according to an exemplary embodiment, plastic tumbling media having an average diameter of between approximately 10 mm and 20 mm are utilized in a tumbling operation for between approximately 3 and 15 minutes to remove a portion of layer 240.

As shown in FIG. 7, a number of apertures or holes 244 (e.g., penetrations) are formed in layer 240 during this process (leaving regions or areas 246 of layer 240 masking or covering portions of layer 230). It should be noted that apertures 244 may have any of a variety of shapes and sizes depending on processing conditions and other factors. By selection of the tumbling media material, carrier liquid, fill levels, and other known parameters, visible features may be produced through non-uniform removal of layer 240. According to other exemplary embodiments, the masking layer may be patterned to produce a desired repeating pattern (e.g., it may be deposited having an interference pattern (e.g., color may be controlled by controlling the thickness of a layer such as an oxide layer, such that there will be an "apparent" color even if the material is transparent due to interference of light), a pattern may be applied by silk screen methods, by a photolithographic process, by a spraying process (e.g., spray painting), by a stamp or stencil, by laser patterning, or by any other suitable method). According to another exemplary embodiment, instead of spraying on a mask material, the etchant may be sprayed onto a mask material to form a pattern in the mask.

Figure 8:
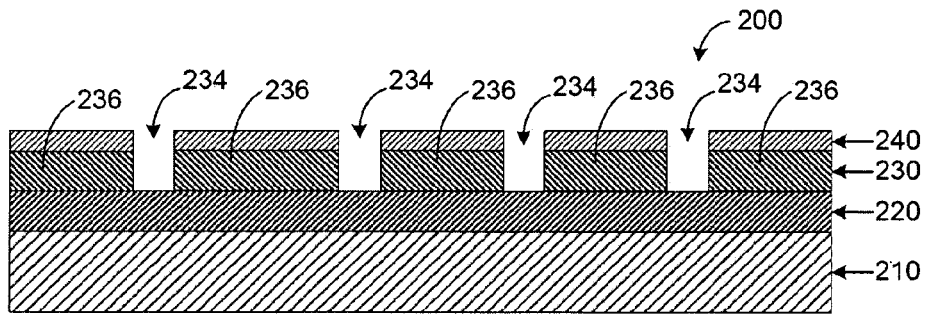

In a step 150 shown in FIG. 8, the exposed portions of layer 230 (i.e., those portions of layer 230 underlying apertures 244 formed in layer 240) are removed in an etching process. According to an exemplary embodiment, article 200 is placed in an etching solution which dissolves layer 230 in the exposed areas, forming apertures 234 (e.g., penetrations, holes, etc.) in layer 230 through which the darker layer 220 is visible. Regions or areas 236 of layer 230 that were covered by regions 246 of layer 240 during the etching process remain above layer 230.

Figure 9:
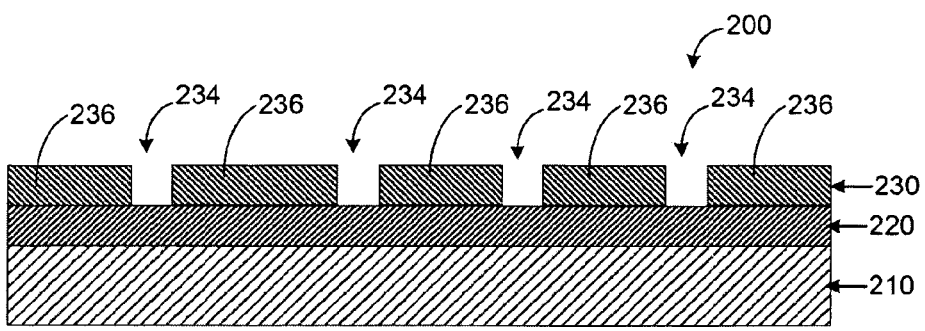

In a step 160 shown in FIG. 9, layer 240 is removed (i.e., the portion of layer 240 remaining above layer 230 after step 140). Layer 240 is removed by use of an organic solvent (e.g., acetone, TCE, etc.) or an etchant (acidic or alkaline) formulated to selectively remove such layer without harming other layers.

Figure 10:
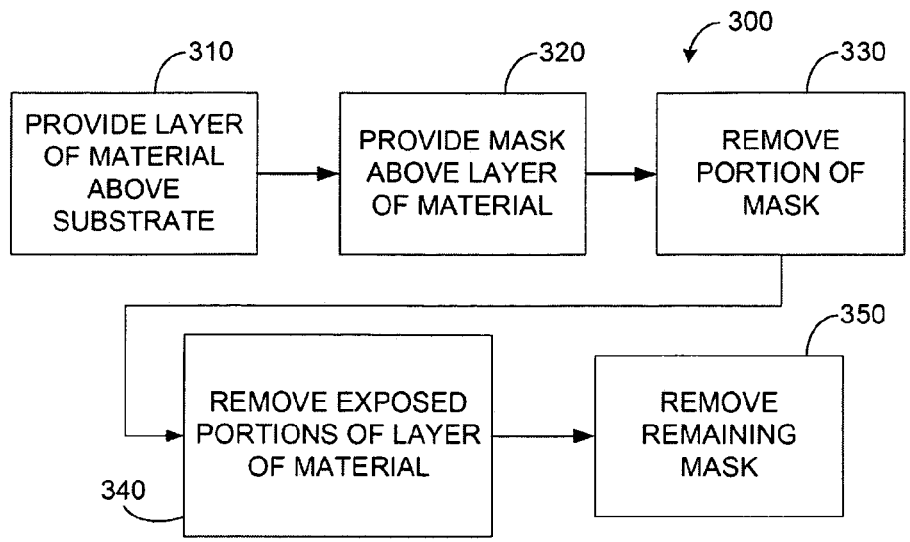
FIG. 10 is a flow diagram illustrating steps in a method of producing an article having a decorative coating according to an exemplary embodiment.

According to another exemplary embodiment, only a single vacuum-deposited layer is employed. FIG. 10 is a flow diagram showing steps in such a method 300, and FIGS. 11-15 are schematic cross-sectional views of steps in the manufacture of an article 400 using method 300.

Figure 11:
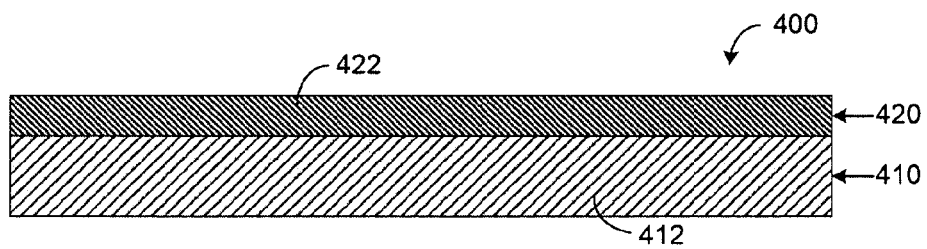
FIGS. 11-15 are schematic cross-sectional views of a portion of an article having a decorative coating provided thereon illustrating steps in the exemplary method represented by the flow diagram of FIG. 10.

In a step 310 shown in FIG. 11, a layer or coating 420 including a material 422 is provided above a substrate 410 comprising a material 412. According to an exemplary embodiment, layer 420 is a layer of an oxy-carbide of zirconium deposited directly on a substrate surface by cathodic arc evaporation.

Figure 12:
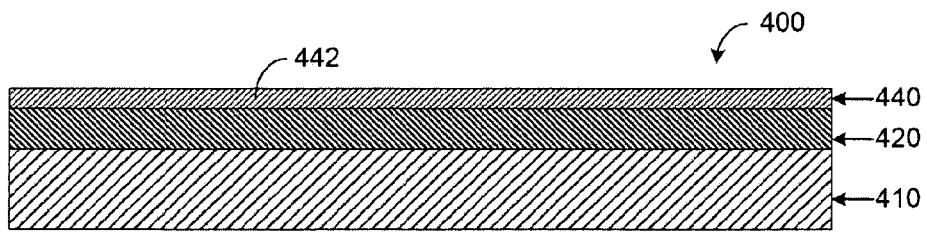

Subsequent to providing layer 420, article 400 is removed from the vacuum chamber and coated with a relatively thin mask or masking layer 440 (e.g., made of a material 442 such as a waterproof permanent ink) in a step 320 shown in FIG. 12. According to an exemplary embodiment, layer 440 has a thickness of between approximately 0.5 microns and 5.0 microns. According to various other exemplary embodiments, the thickness of the masking layer may be between approximately 0.01 microns and 50 microns.

Figure 13:
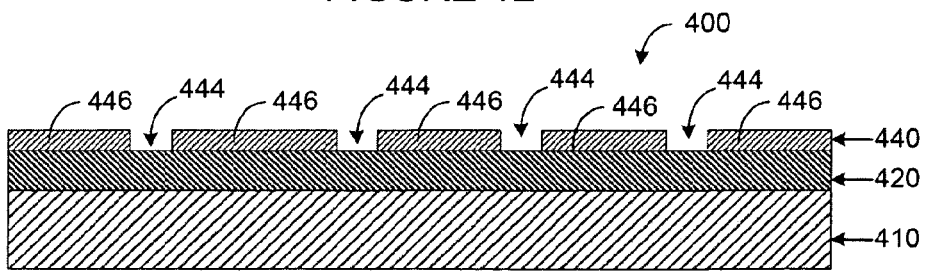

In a step 330 shown in FIG. 13, a portion of layer 440 is removed as described above with respect to FIG. 7. A number of apertures or holes 444 are formed in layer 440 during this process (leaving regions or areas 446 of layer 440 masking or covering portions of layer 420). It should be noted that apertures 244 may have any of a variety of shapes and sizes depending on processing conditions and other factors. By selection of the tumbling media material, carrier liquid, fill levels, and other known parameters, visible features may be produced through non-uniform removal of layer 440. According to other exemplary embodiments, the masking layer may be patterned to produce a desired repeating pattern (e.g., it may be deposited having an interference pattern (e.g., color may be controlled by controlling the thickness of a layer such as an oxide layer, such that there will be an "apparent" color even if the material is transparent due to interference of light), a pattern may be applied by silk screen methods, by a photolithographic process, by a spraying process (e.g., spray painting), by a stamp or stencil, by laser patterning, or by any other suitable method). According to another exemplary embodiment, instead of spraying on a mask material, the etchant may be sprayed onto a mask material to form a pattern in the mask.

Figure 14:
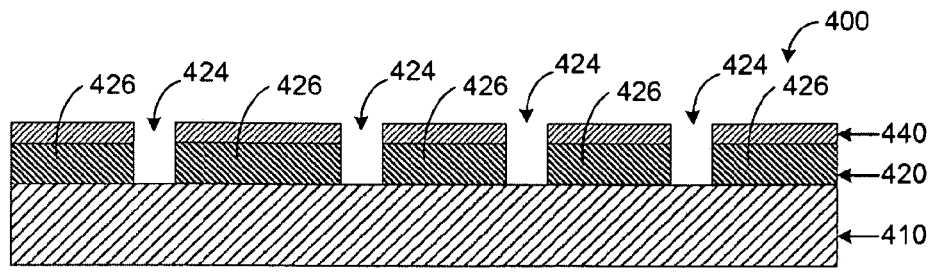

In a step 340 shown in FIG. 14, the exposed portions of layer 420 (i.e., those portions of layer 420 underlying apertures 444 formed in layer 440) are removed in an etching process. According to an exemplary embodiment, article 400 is placed in an etching solution which dissolves layer 420 in the exposed areas, forming apertures 424 (e.g., penetrations, holes, etc.) in layer 420 through which substrate 410 is visible. Regions or areas 426 of layer 420 that were covered by regions 446 of layer 440 during the etching process remain above substrate 410.

Figure 15:
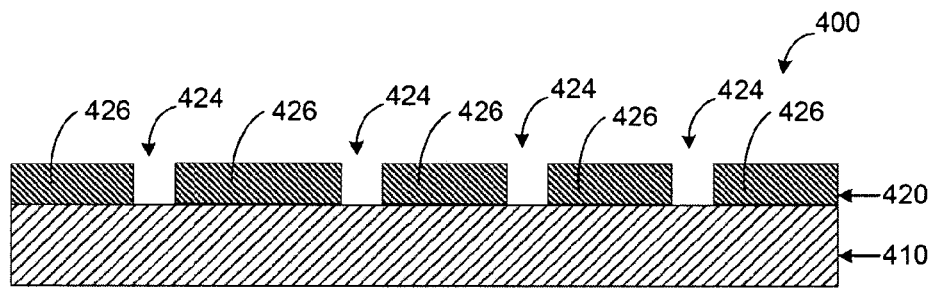

In a step 350 shown in FIG. 15, layer 440 is removed (i.e., the portion of layer 440 remaining above layer 420 after step 340). Layer 440 is removed by use of an organic solvent (e.g., acetone, TCE, etc.) or an etchant (acidic or alkaline) formulated to selectively remove such layer without harming other layers.

Methods 100 and 300 as described above with respect to FIGS. 3-15 may be used to form visibly-patterned layers that include penetrations (e.g., apertures 234 and 424) through which an underlying material (e.g., layer 220 in FIG. 9 and substrate 410 in FIG. 15) may be seen. According to an exemplary embodiment, such underlying materials have a different color than the overlying layers of material. In this manner, articles having finishes that appear to be streaked, speckled, marbled, "antique", "aged", "distressed", or the like can be produced. The embodiment shown and described with respect to FIGS. 3-9 utilizes a multiple-layer deposition process, while the embodiment shown and described with respect to FIGS. 10-15 utilizes a single-layer deposition process. According to various other exemplary embodiments, a different number of layers (e.g., three or more layers) may be provided (e.g., deposited) and patterned as may be appropriate to provide the desired surface characteristic or appearance.

According to yet another exemplary embodiment, a coating layer may be patterned directly by mechanical or chemical treatment to expose portions of an underlying surface having a different color. In this manner, articles such as those illustrated schematically in FIGS. 9 and 15 may be produced without the need to use a masking layer. For example, a relatively dark layer of an oxy-carbide of zirconium can be tumbled with plastic media in an abrasive slurry for a controlled period of time in order to create a decorative pattern of penetrations that exposes a portion of an underlying surface having a different color (such as an underlying layer of a nitride of zirconium). Textured surfaces may be buffed with a polishing compound to remove the coating on high spots and exposing portions of the underlying surface having a different color. Non-uniform application of chemical etchants by means of a brush, stamp, etc. may also be used to directly pattern colored layers.

Figure 18:
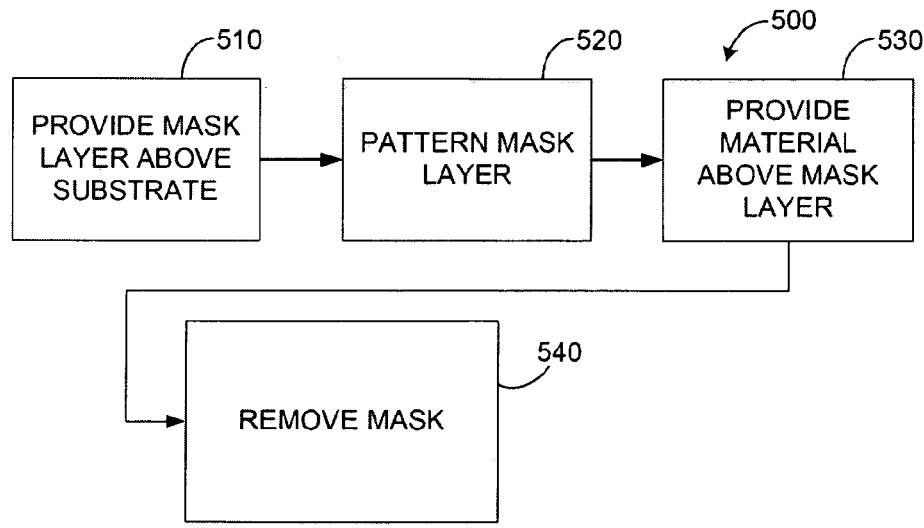
FIG. 18 is a flow diagram illustrating steps in a method of producing an article having a decorative coating according to an exemplary embodiment.
Figure 16:
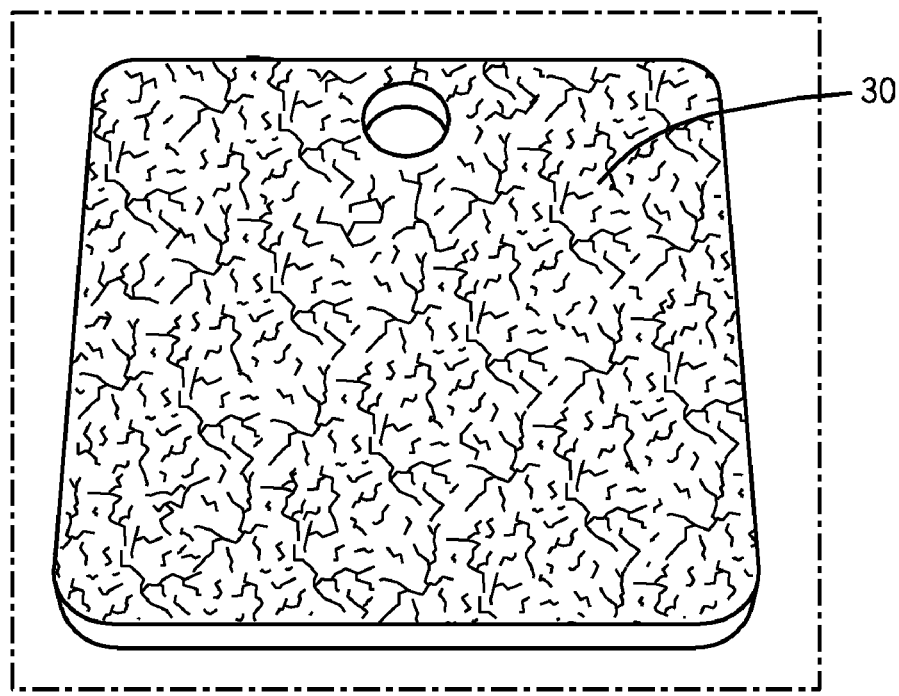
FIG. 16 is a photograph of an article having a decorative coating provided thereon according to an exemplary embodiment.
Figure 17:
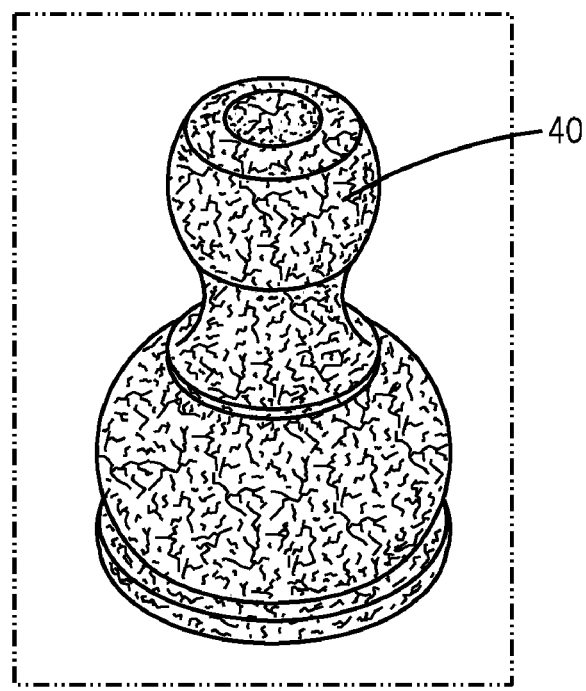
FIG. 17 is a photograph of an article having a decorative coating provided thereon according to an exemplary embodiment.

FIGS. 16 and 17 are photographs illustrating articles 30 and 40 produced using a method 500 for providing decorative coatings or finishes according to an exemplary embodiment. According to an exemplary embodiment, method 500 may be referred to as a "lift-off process," as will be described in greater detail below. FIG. 18 is a flow diagram illustrating exemplary steps of method 500, and FIGS. 19-22 are schematic cross-sectional views of an article 600 showing steps in method 500.

Figure 19:
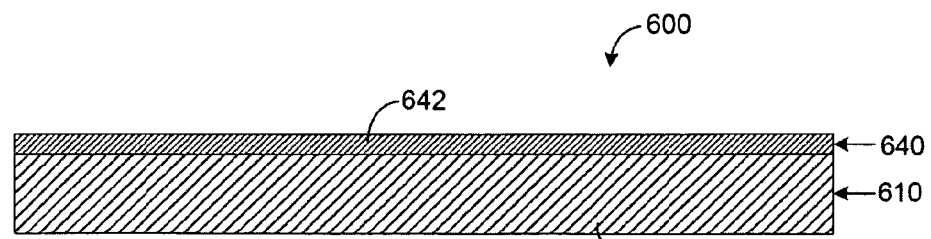
FIGS. 19-22 are schematic cross-sectional views of a portion of an article having a decorative coating provided thereon illustrating steps in the exemplary method represented by the flow diagram of FIG. 18.

In a step 510 shown in FIG. 19, a layer 640 (e.g., an etch-masking layer comprising a material 642 similar to material 242 described above) is provided directly on a substrate 610 of article 600.

Figure 20:
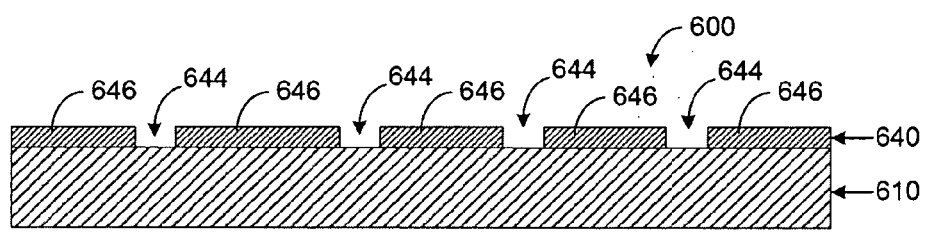

In a step 520 shown in FIG. 20, layer 640 is patterned (e.g., by a tumbling process) similar to layer 240 described above with respect to FIG. 7. As a result of this process, apertures 644 are formed in layer 640, leaving behind regions or areas 646 that mask or cover portions of substrate 610.

Figure 21:
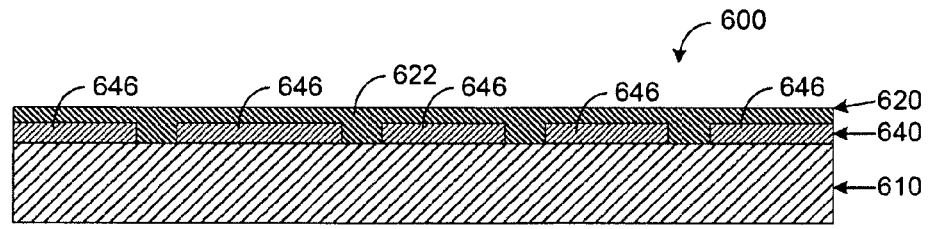

In a step 530 shown in FIG. 21, a layer 620 including a material 622 may be provided above layer 640 and substrate 610 such that material 622 is provided both above remaining portions 646 of layer 640 and in apertures 644 formed therein (e.g., article 600 may be placed in a vacuum chamber and coated with layer 620). According to an exemplary embodiment, layer 620 has a different color from that of substrate 610.

Figure 22:
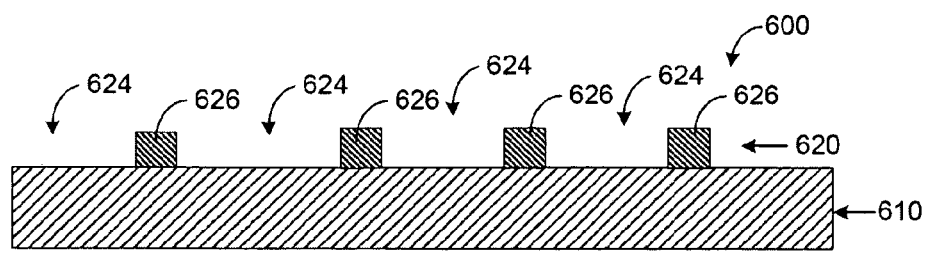

In a step 540 shown in FIG. 22, remaining portions 646 of layer 640 are removed (e.g., dissolved with a solvent or otherwise removed) in such a way as to also remove that portion of layer 620 that was deposited on top of it, thereby forming visibly-patterned penetrations in layer 620 through which the underlying substrate surface having a different color can be seen. As shown in FIG. 22, apertures 624 are formed in layer 620 due to removal of the remaining portions 646 of layer 640 and the overlying portions of layer 620. Regions or areas 626 of layer 620 which were provided in apertures 644 in step 530 remain after the removal of portions 646 and mask or cover underlying regions of substrate 610.

While the embodiment shown and described with respect to FIGS. 18-22 illustrates the provision of layer 640 directly on an underlying substrate 610, according to another exemplary embodiment, a substrate may include a layer of material provided thereon prior to the provision of a mask layer (such as layer 640). In this manner, the patterned layer 620 may be provided such that aperture or penetrations formed therein allow an underlying layer of material to be seen (as shown, for example, in FIG. 9, which shows a patterned layer 230 provided above an underlying base-color layer 220). Thus, this type of lift-off process is performed after vacuum deposition of a base-color layer, such that the base-color layer is visible through the penetrations formed in the top layer by a lift-off process. Lift-off processes may be useful, for example, to avoid the necessity of etching materials, such as DLC, that are difficult to etch.

For example and not for purposes of limitation, known PVD (physical vapor deposition) vacuum processes suitable for practicing the methods described in the various exemplary embodiments include cathodic arc evaporation, sputtering, thermal and e-beam evaporation, and ion-beam sputtering, with cathodic arc evaporation and sputtering being preferred PVD processes. Preferred chemical vapor deposition (CVD) methods include hot-filament plasma enhanced CVD (PECVD) methods and ion-beam PECVD methods, and include plasma and ion source methods using ECR (electron-cyclotron resonance), microwave, or radio-frequency excitation. PVD and CVD methods may also in various exemplary embodiments be combined, for example, by depositing a base-color layer of dark-grey or black diamond-like carbon by a hot-filament PECVD method, then depositing a ZrN coating layer by cathodic arc evaporation. According to one exemplary embodiment, physical vapor deposition equipment as may be used in conjunction with the method disclosed herein may include VT 3000 or VT 1500 batch coaters commercially available from Vapor Technologies of Boulder, Colo.

Preferred materials for base-color layers (e.g., layer 220) and patterned coating layers (e.g., layers 230, 420, and 620) include such known materials as the nitrides, oxides, carbides, oxy-nitrides, oxy-carbides, carbo-nitrides, and oxy-carbo-nitrides of such metals as zirconium, titanium, hafnium, chromium, scandium, and various alloys comprising such metals. Highly preferred materials include those comprising zirconium, and in particular the nitrides, oxy-carbides, and oxy-carbo-nitrides of zirconium and zirconium alloys such as Zr—Ti and Zr—Sc. The terms nitrides, oxides, carbides, oxy-nitrides, oxy-carbides, carbo-nitrides, and oxy-carbo-nitrides of metals refer to compounds and mixtures of a metal and the corresponding combination of reactive components oxygen, nitrogen, and carbon. These terms refer to both stoichiometric and non-stoichiometric compounds, referring to those which have a deficit or excess of one or more reactive components relative to the quantity required to combine in the formulaically specified ratios. They also refer in particular to sub-stoichiometric compounds having a deficit of one or more reactive components.

Materials for base-color layers and patterned coating layers also may include carbon, and in particular an amorphous, usually hydrogenated, glassy and hard form of carbon known as diamond-like carbon or DLC. DLC can be vacuum-deposited in a variety of known ways including hot-filament or ion-beam PECVD, in which either electron current from a hot filament, or an ion beam source, is used to ionize a carbon-bearing gas such as methane or acetylene. DLC is a semi-transparent material which becomes grayish to nearly black in appearance as the layer thickness is increased. DLC is advantageous as a base-color layer upon which zirconium-based or other metal-based patterned layers may be deposited, since DLC is not attacked by the etchants used for metal-based layers. Preferred materials for base-color layers and patterned coating layers also include anodized layers of such metals as aluminum, niobium, titanium, zirconium, and hafnium. Anodization refers to wet-chemical electrolytic processes by which a layer of a metal is oxidized. Transparent anodized layers of controlled thicknesses exhibit interference colors ranging through the entire interference spectrum. Porous anodized layers may be dyed using known organic dyes to produce durable colored finishes in a variety of colors including black and grey.

Known etching methods include wet-chemical etching with known acids, bases, and commercial etching solutions. It is also known to etch such materials as ZrN, ZrOC, and the like using a dilute solution of ammonium bifluoride. Etching may also be accomplished using a plasma etching process in a vacuum system. In some cases it is desirable to employ an etch-stop layer between the underlying surface and the patterned layer, in order to prevent over-etching of the underlying surface. Such an etch-stop layer is particularly desirable when the two color layers are similar materials and etched by the same processes. The etch-stop layer may be of a transparent material such the underlying surface is visible without removal of the etch-stop layer, or may be of a non-transparent material which can be subsequently removed by a process which does not damage the color layers. Chromium is a possible candidate as an etch-stop material as it is not aggressively etched by ammonium bifluoride and is galvanically compatible with the zirconium compounds and the underlying plating stack.

Mask materials (e.g., used to form mask layers 240, 440, and 640) may include any material that resists the modification process used to modify the unmasked regions of the coating layer to be patterned, and that can itself be patterned by the modification process selected to create the desired pattern in the mask layer. Suitable materials may include inks, photoresists, paints, lacquers, waxes, and thin metal films.

Processes for randomly or non-uniformly patterning the masking layer include known processes such as scratching, sanding, buffing by wire, cloth, or abrasive wheel, tumbling in ceramic, nutshell, plastic, or abrasive media, sandblasting, etc. Processes such as photolithography (as by focused image or scanning laser techniques) and ion-beam lithography may also be used.

A random or non-uniform patterned masking layer may be deposited directly onto the substrate by spraying, condensation, or coalescence of droplets or streaks of a masking material on the coating surface, by applying a masking material through a silk-screen or stencil, writing with a pen or marker containing an masking material, stamping with a rubber stamp carrying a masking material, and other known methods of applying such materials non-uniformly to surfaces. A preferred method for non-uniform application of a masking layer is to use a silk-screen created using a photographic process. Such silk-screens can produce masking layers comprising images such as geometric or random decorative patterns, corporate logos, digitized images, and text. Such silk-screened patterns may comprise smaller dots, or shaped pixels of variable size, which are individually indistinguishable to the human eye, but which collectively form patterns with visually distinguishable features.

According to another exemplary embodiment, a non-uniform modification process used to pattern a mask layer includes tumbling or vibratory finishing in media such as plastic or ceramic pellets, nutshells, abrasive media, and the like. One exemplary method for creating a patterned masking layer comprises the steps of a) applying waterproof masking layer uniformly or semi-uniformly over the surface of the part, b) tumbling multiple parts in a barrel partially filled with plastic tumbling media, preferably but non necessarily with a carrier liquid, for a time period sufficient to remove portions of the masking layer but not all of it. Desirable accents in the pattern produced by tumbling may be produced by applying the masking agent in a non-uniform manner such that the masking layer is thicker in some regions and thinner or absent altogether in other regions.

It should be noted that the various processes described herein may be performed multiple times to obtain desired effects. For example, multiple coatings having various colors may be applied to an article to give an article a multi-colored surface appearance (e.g., three or more different colors may be visible on the surface of the article). Those of ordinary skill in the art reviewing this disclosure will appreciate that any number of layers and combinations of layers may be utilized depending on the desired appearance of the article for a given application.

According to another exemplary embodiment, a patterning process similar to those described above may be used in order to prepare an article having one or more pictures, drawings, logos, signs, or other information provided thereon. For example, a mask material may be provided and patterned to include a logo, after which an underlying layer may be etched to expose an underlying surface in the pattern of the logo. It will be appreciated than any number of variations are possible.

The following examples are provided for purposes of illustration and not of limitation. Those of skill in the art reviewing this document will appreciate that various other combinations of methods and layer materials may be to produce patterned decorative coatings on a substrate according to various other exemplary embodiments. It will also be appreciated that patterned coatings having more than two colors may be produced by repeated application of the techniques and materials disclosed herein.

Example 1

According to a working example, a brass faucet handle was electroplated with a duplex nickel and chromium plating stack to provide it with a chromium-colored surface. A coating layer including an oxy-carbide of zirconium was deposited on the part using cathodic arc evaporation in a vacuum chamber at sub-atmospheric pressure. A second coating layer of a sub-stoichiometric nitride of zirconium was afterwards applied, also using cathodic arc evaporation. An etch-mask layer of a water resistant permanent ink was applied to the part. The part was subjected to a tumbling or vibratory mass finishing operation using plastic media to partially remove the ink. The part was then etched in a dilute solution of ammonium bifluoride to remove the portion of the top coating layer that is exposed in the areas where the masking layer has been removed. Finally, the part was dipped in a solvent (e.g., acetone, TCE, etc.) to remove the ink. The top coating layer in the areas protected by the ink was still intact, providing a visibly-patterned "aged pewter" surface appearance.

Example 2

According to a theoretical example, an injection-molded plastic shower spray housing is electroplated with a copper, nickel, and chromium plating stack having a chromium-colored surface. The part is mounted in a vacuum chamber and coated with a dark grey layer of an oxy-carbide of zirconium having a thickness of approximately 0.4 microns. The part is removed from the vacuum chamber and a lacquer masking material is non-uniformly applied in a streaked manner using an automated brushing system, leaving at least a portion of the surface of the oxy-carbide layer exposed through penetrations (uncovered areas) in the masking layer. The part is then etched in a dilute solution of ammonium bifluoride to remove the portion of the coating layer that is exposed. Finally, the part is rinsed with a solvent to remove the lacquer masking material, exposing the surface of the remaining, un-etched oxy-carbide layer and providing a "distressed" finished with either a dark background and chromium-colored highlights, or vice-versa depending on the ratio of the surface areas of the masked and unmasked areas of the coating surface.

Example 3

According to another theoretical example, a zinc die-cast bathtub spout is electroplated with a copper, nickel, and chromium plating stack having a chromium-colored surface. A thin etch-mask layer of a waterproof ink or an acrylic lacquer is applied to the part. The part is then automatically or manually "wire-brushed" in a random or streaked fashion using a motor-mounted wire or fiber wheel, thus creating a scratch pattern in the etch mask layer which exposes a portion of the chromium-colored substrate surface. The part is mounted in a vacuum chamber, and coated with a layer of dark-grey or black diamond-like carbon. The carbon may be deposited by ion-beam or hot-filament PECVD and has a thickness of at least about 0.2 microns and preferably at least about 0.3 microns to 0.5 microns or more, with thicker coatings providing darker colors. A thin metal adhesion layer comprising, for example, zirconium may optionally be deposited prior to the carbon. The part is then removed from the vacuum system and placed in a solvent bath with ultrasonic agitation. The masking layer is dissolved by the solvent and the portion of the DLC layer deposited on top of the unscratched areas of the masking layer is also removed. The DLC deposited on the exposed portions of the substrate surface through the scratches in the masking layer remains in place on the substrate surface, forming a decorative gray or black accent pattern reproducing the scratch pattern in the masking layer. Those of skill in the art will appreciate that similar patterns may be obtained using other dark-colored materials such as the oxy-carbides and oxy-carbo-nitrides of zirconium.

Example 4

According to another theoretical example, an injection-molded plastic automotive trim part is first base-coated with a polymer layer by a known process in order to provide a level, glossy substrate surface. The part is mounted in a vacuum chamber, and coated with a layer of dark-grey or black diamond-like carbon by a hot-filament or ion-beam PECVD process. The part is then coated with a layer of zirconium-titanium nitride using a cathodic arc evaporation process. The part is removed from the vacuum chamber, and a permanent ink masking material is applied to the part through a patterned silk-screen, thus creating a non-continuous masking layer having a selected pattern such as a corporate logo, digitized image, or other decorative or informational pattern. The part is then immersed in a dilute ammonium bifluoride solution until the zirconium-titanium nitride is removed in the areas unprotected by the masking layer, leaving behind durable, bright gold-colored features having a visible pattern on a dark gray or black background.

Example 5

According to another theoretical example, a stainless steel spoon is polished and cleaned by known methods, mounted in a vacuum chamber, and coated by PECVD with a base-color layer of gray or black DLC having a thickness preferably at least about 0.3 micron to 1 micron. A thin metal adhesion layer comprising, for example, zirconium may optionally be deposited prior to the carbon. A layer of zirconium nitride is then deposited on top of the carbon layer by cathodic arc evaporation. The part is removed from the vacuum chamber, and a waterproof-ink masking layer is applied to the part. The part is tumbled in a barrel with plastic tumbling media until part, but not all, of the masking layer is removed. The part is then immersed in a dilute ammonium bifluoride solution until the zirconium nitride is removed in the areas not covered by the masking layer. If the masked areas are relatively large compared to the unmasked areas, a spoon having a patterned, decorative "brass on black" appearance may be thereby for example produced. If the masked areas are relatively small compared to the unmasked areas, a spoon having a patterned, decorative "black antique" finish on brass, for example, may thereby be produced.

Example 6

According to another theoretical example, a brass doorknob is electroplated with known materials, comprising for example a nickel-tin alloy. The part is mounted in a vacuum chamber and coated with a layer of zirconium nitride by cathodic arc evaporation. The part is then coated by sputtering with a layer of aluminum. The part is removed from the vacuum chamber and a masking layer of permanent ink is applied and subsequently patterned in a tumbling process as described above. The portion of the aluminum coating which is exposed through the penetrations in the masking layer is then black-anodized by a known electrochemical process. The masking layer is removed with a solvent, and the un-anodized portions of the aluminum layer are removed with an alkaline etching agent, such as NaOH, that does not damage the underlying zirconium-based layer. A durable decorative "black antique" finish, for example, may thereby be produced.

Example 7

According to a working example, a brass towel ring was electroplated with a satin-textured nickel and chromium plating stack having a chromium-colored surface. A coating layer including a black colored oxy-carbide of zirconium was deposited on the part using cathodic arc evaporation in a vacuum chamber at sub-atmospheric pressure at a thickness of 0.4 microns. A layer of copper was then applied using magnetron sputtering to a thickness of 0.25 microns. The part was subjected to a vibratory mass finishing operation using plastic media to partially remove the copper, exposing a portion of the underlying zirconium oxy-carbide layer. A final coating layer of a brass colored carbo-nitride of zirconium was afterwards applied to a thickness of 0.15 microns, also using cathodic arc evaporation. The copper lift-off layer was then etched in a dilute solution of hydrogen peroxide and sulfuric acid. Finally, the part was placed in an ultrasonic water bath to remove the loosely adhered top zirconium carbo-nitride material that was directly on top of the copper. The top zirconium carbo-nitride layer in the areas where the copper was removed by vibratory finishing remained intact, providing a visibly-patterned "weathered brass" surface appearance.

Example 8

According to another working example, a zinc faucet handle base was electroplated with a copper, nickel and chromium plating stack having a chromium-colored surface. A coating layer including a gold-colored layer of zirconium nitride was deposited to a thickness of 0.5 microns on the part using cathodic arc evaporation in a vacuum chamber at sub-atmospheric pressure. Without venting the vacuum chamber, a second coating layer of chromium was afterwards applied, using magnetron sputtering, to a thickness of 0.2 microns. Finally, still without venting, a dark layer of zirconium carbo-nitride was applied using cathodic arc evaporation to a thickness of 0.5 microns. An etch-mask layer of a water resistant permanent ink was applied to the part. The part was subjected to a tumbling or vibratory mass finishing operation using plastic media to partially remove the ink. The part was then etched in a dilute solution of ammonium bifluoride to remove the portion of the top dark coating layer that is exposed in the areas where the masking layer has been removed. This first etch was impeded at the chromium "etch-stop" layer. Subsequently, the part was dipped in a solution of 5% sodium hydroxide where the exposed chromium underwent anodic etching by holding the part at +8.0 volts relative to a flat stainless steel electrode in the same bath. This final etching step selectively etched the chromium; visually exposing in areas the gold-colored zirconium nitride under-layer. Finally, the part was rinsed in acetone to remove the ink. The top dark coating layer in the areas protected by the ink remained intact, providing a visibly-patterned "aged pewter" surface appearance.

It is important to note that the articles and methods shown and described with respect to the various exemplary embodiments are illustrative only. Although only a few embodiments have been described in detail in this disclosure, those skilled in the art who review this document will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. Accordingly, all such modifications are intended to be included within the scope of the present invention as defined in the appended claims. The order or sequence of any process or method steps may be varied or re-sequenced according to other exemplary embodiments. Other substitutions, modifications, changes and omissions may be made in the design, operating conditions and arrangement of the preferred and other exemplary embodiments without departing from the scope of the present inventions as expressed in the appended claims.

What is claimed is:

1. A method for producing an article having a decorative coating comprising:
    providing a product including a substrate having a surface electroplated with nickel and chromium;
    depositing at least a first coating layer onto at least a portion of the electroplated surface of the substrate using a physical or chemical vapor deposition method in a vacuum chamber at sub-atmospheric pressure, the first coating layer comprising a first material of nitride of zirconium having a first color;

depositing a second metal layer of oxy-carbide zirconium over the first coating layer, the second metal layer having a second color that is visually contrasting to the first color; and tumbling or vibratory finishing the product with a media to form a random non-uniform arrangement of apertures or holes through the second metal layer, the apertures extending through the second metal layer and exposing a portion of the first layer;

wherein the apertures create a decorative pattern comprising features distinguishable by an unaided human eye.

2. The method of claim 1, wherein the second material comprises an anodized layer comprising a metal.

3. The method of claim 1, wherein at least one of the first material and the second material comprises diamond-like carbon.

4. The method of claim 1, wherein the first coating layer is deposited using one of a cathodic arc evaporation process and a hot-filament PECVD method.

5. The method of claim 1, wherein the first material comprises an anodized layer comprising a metal.

6. The method of claim 1, further comprising creating the penetrations in the masking layer using a mass finishing operation handling at least ten parts simultaneously.

7. The method of claim 1, wherein the patterning process comprises forming a non-continuous masking layer, the masking layer having penetrations through which a portion of the first coating layer is exposed.

8. The method of claim 7, wherein the patterning process comprises removing portions of the first coating layer under the penetrations in the masking layer.

9. The method of claim 7, further comprising forming the penetrations using a brush.

10. The method of claim 7, further comprising forming the penetrations using a photolithographic process.

11. The method of claim 7, further comprising forming the penetrations using a non-uniformly applied masking material.

12. The method of claim 11, further comprising providing the masking material non-uniformly using a stamp or stencil.

13. The method of claim 11, further comprising providing the masking material non-uniformly using at least one of a silk-screening process and a spraying process.

\* \* \* \* \*